(12) United States Patent
Forbes et al.

(10) Patent No.: US 7,875,529 B2
(45) Date of Patent: Jan. 25, 2011

(54) SEMICONDUCTOR DEVICES

(75) Inventors: Leonard Forbes, Corvallis, OR (US); Paul A. Farrar, Okatie, SC (US); Arup Bhattacharyya, Essex Junction, VT (US); Hussein I. Hanafi, Basking Ridge, NJ (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 308 days.

(21) Appl. No.: 11/867,733

(22) Filed: Oct. 5, 2007

(65) Prior Publication Data

US 2009/0090950 A1    Apr. 9, 2009

(51) Int. Cl.
*H01L 21/30* (2006.01)
*H01L 21/46* (2006.01)

(52) U.S. Cl. .................. 438/455; 438/458; 438/459; 257/49; 257/56; 257/204; 257/E23.179

(58) Field of Classification Search ................. 438/455, 438/458, 459; 257/49, 56, 204
See application file for complete search history.

(56) References Cited

U.S. PATENT DOCUMENTS

| | | | |
|---|---|---|---|
| 3,959,047 A | | 5/1976 | Alberts et al. |
| 4,612,083 A | * | 9/1986 | Yasumoto et al. ............ 438/59 |
| 4,903,344 A | | 2/1990 | Inoue |
| 5,236,118 A | * | 8/1993 | Bower et al. ................ 228/193 |
| 5,240,878 A | | 8/1993 | Fitzsimmons et al. |
| 5,457,345 A | | 10/1995 | Cook et al. |
| 5,719,070 A | | 2/1998 | Cook et al. |
| 5,995,408 A | | 11/1999 | Kinney |

(Continued)

FOREIGN PATENT DOCUMENTS

WO    WO 2006/038030 A3    4/2006

(Continued)

OTHER PUBLICATIONS

Solberg, Vern, et al. "Reliable and Low Cost Wafer Level Packaging". IEEE/CPMT Int'l Electronics Manufacturing Technology Symposium, 2000, pp. 108-114.

(Continued)

*Primary Examiner*—George Fourson
*Assistant Examiner*—John M Parker
(74) *Attorney, Agent, or Firm*—Brooks, Cameron & Huebsch, PLLC

(57) ABSTRACT

Methods, devices, modules, and systems providing semiconductor devices in a stacked wafer system are described herein. One embodiment includes a first wafer for NMOS transistors in a CMOS architecture and a second wafer for PMOS transistors in the CMOS architecture, with the first wafer being bonded and electrically coupled to the second wafer to form at least one CMOS device. Another embodiment includes a number of DRAM capacitors formed on a first wafer and support circuitry associated with the DRAM capacitors formed on a second wafer, with the first wafer being bonded and electrically coupled to the second wafer to form a number of DRAM cells. Another embodiment includes a first wafer having a number of vertical transistors coupled to a data line and a second wafer having amplifier circuitry associated with the number of vertical transistors, with the first wafer being bonded and electrically coupled to the second wafer.

13 Claims, 15 Drawing Sheets

U.S. PATENT DOCUMENTS

| | | | |
|---|---|---|---|
| 6,033,957 | A | 3/2000 | Burns, Jr. et al. |
| 6,040,210 | A | 3/2000 | Burns, Jr. et al. |
| 6,136,689 | A | 10/2000 | Farrar |
| 6,271,542 | B1 * | 8/2001 | Emma et al. .................. 257/67 |
| 6,380,629 | B1 | 4/2002 | Kim |
| 6,696,746 | B1 | 2/2004 | Farrar et al. |
| 6,717,167 | B2 | 4/2004 | Noda |
| 6,744,082 | B1 | 6/2004 | Forbes et al. |
| 6,774,477 | B2 | 8/2004 | Han |
| 6,798,009 | B2 | 9/2004 | Forbes et al. |
| 6,821,826 | B1 * | 11/2004 | Chan et al. .................. 438/150 |
| 6,844,253 | B2 | 1/2005 | Farrar |
| 6,878,396 | B2 | 4/2005 | Farrar et al. |
| 6,946,389 | B2 | 9/2005 | Farrar et al. |
| 6,958,287 | B2 | 10/2005 | Farrar et al. |
| 6,998,711 | B1 | 2/2006 | Farrar |
| 7,015,525 | B2 | 3/2006 | Forbes et al. |
| 7,015,559 | B2 | 3/2006 | Murphy et al. |
| 7,028,879 | B2 | 4/2006 | Farrar et al. |
| 7,157,787 | B2 | 1/2007 | Kim et al. |
| 2003/0092244 | A1 | 5/2003 | Oi et al. |
| 2003/0139029 | A1 | 7/2003 | Haba et al. |
| 2005/0009236 | A1 | 1/2005 | Ball |
| 2006/0043571 | A1 * | 3/2006 | Mousa et al. ............... 257/700 |
| 2006/0108675 | A1 | 5/2006 | Colgan et al. |
| 2006/0110906 | A1 | 5/2006 | Han |
| 2006/0113680 | A1 | 6/2006 | DiStefano |
| 2006/0121645 | A1 | 6/2006 | Ball |
| 2006/0134829 | A1 | 6/2006 | Rosa et al. |
| 2006/0139643 | A1 | 6/2006 | Chen |
| 2006/0172507 | A1 | 8/2006 | Best et al. |
| 2006/0226491 | A1 * | 10/2006 | Gauthier et al. ............. 257/369 |
| 2007/0048994 | A1 | 3/2007 | Tuttle |
| 2007/0080440 | A1 | 4/2007 | Cheng et al. |
| 2007/0080448 | A1 | 4/2007 | DeMulder et al. |
| 2007/0145367 | A1 * | 6/2007 | Chen et al. .................... 257/49 |
| 2007/0152313 | A1 | 7/2007 | Periaman et al. |
| 2007/0170360 | A1 | 7/2007 | Gooch et al. |
| 2008/0108185 | A1 * | 5/2008 | Mousa et al. ............... 438/150 |
| 2008/0153200 | A1 * | 6/2008 | Sitaram ..................... 438/106 |

FOREIGN PATENT DOCUMENTS

| | | |
|---|---|---|
| WO | WO 2007/069376 | 6/2007 |

OTHER PUBLICATIONS

Calata, Jesus N., et al. "Evaluation of Interconnect Technologies for Power Semiconductor Devices". 2002 Inter Society Conference on Thermal Phenomena, pp. 1089-1096.

Knickerbocker, J.U., et al. "Development of next-generation system-on-package (SOP) technology . . . ".http;//researchweb.watson.ibm.com/journal/rd/494/knickerbocker.htm, .2005.

Patel, Chirag S., et al. "Characterization of Flip Chip Microjoins up to 40 GHz using Silicon Carrier". IEEE, 2005, pp. 129-131.

Deferm, Ludo, et al. "Integration Difficulties and Limitations in sub-0.25 um CMOS-based Technologies". Proc. 22nd International . . . , vol. 2, N15, Serbia, 2000, pp. 399-406.

Shahadi, Ghavan G. "Challenges of CMOS Scaling at below 0.1 um". The 12th International Conference on Microelectronics, Tehran, 2000, pp. 5-6.

Hanafi, Hussein I., et al. "A Scalable Low Power Vertical Memory". IEEE, 1995, pp. 657-660.

Kim, Kinam. "Technology for sub-50nm DRAM and NAND Flash Manufacturing". IEEE, 2005.

Nakamura, S., et al. "Giga-bit DRAM cells with low capacitance and low resistance bit-lines on buries MOSFET's and capacitors by using bonded SOI . . . ". IDEM, 1995, pp. 889-892.

Kim, Il-Kwon, et al. "Advanced Integration Technology for a Highly Scalable SOI DRAM with SOC . . . ". IDEM, 1996, pp. 605-608.

Sunouchi, K. et al. "A Surrounding Gate Transistor (SGT) Cell for 64/256 Mbit DRAMs." IEDM Tech Dig., 1989, pp. 23-26.

Inoue, M. et al. "A 16Mb DRAM with an open bit-line architecture." ISSCC Dig. Tech. Papers, Feb. 1988, pp. 246-247.

* cited by examiner

SEMICONDUCTOR DEVICES

TECHNICAL FIELD

The present disclosure relates generally to electronic semiconductor systems and devices and, more particularly, to stacked wafer semiconductor systems and devices.

BACKGROUND

Integrated circuits (ICs) form the basis for many electronic systems. Essentially, an integrated circuit (IC) includes a vast number of transistors and other circuit elements that are formed on a single semiconductor wafer or semiconductor chip and are interconnected to implement a desired function. Increasing complexity of these ICs leads to an increasing number of linked transistors and other circuit elements.

Many modern electronic systems are created through the use of a variety of different ICs each performing one or more specific functions. For example, many computer systems include at least one microprocessor chip and a number of memory chips. The microprocessor chip and memory chips can be formed on separate chips, packaged independently, and interconnected on, for example, a printed circuit board (PCB).

As IC technology has progressed, there have been attempts to combine the functionality of IC devices which are fabricated on separate wafers or chips to provide benefits such as reduced packaging size and/or increased system performance. Examples of such combinations include a chip on chip (COC) approach in which one chip is stacked on another chip, a multi-chip module (MCM) approach in which multiple chips are stacked on a common substrate, and a "system on a chip" approach in which a single chip includes all of the IC devices of a system.

DETAILED DESCRIPTION

Figure 1:
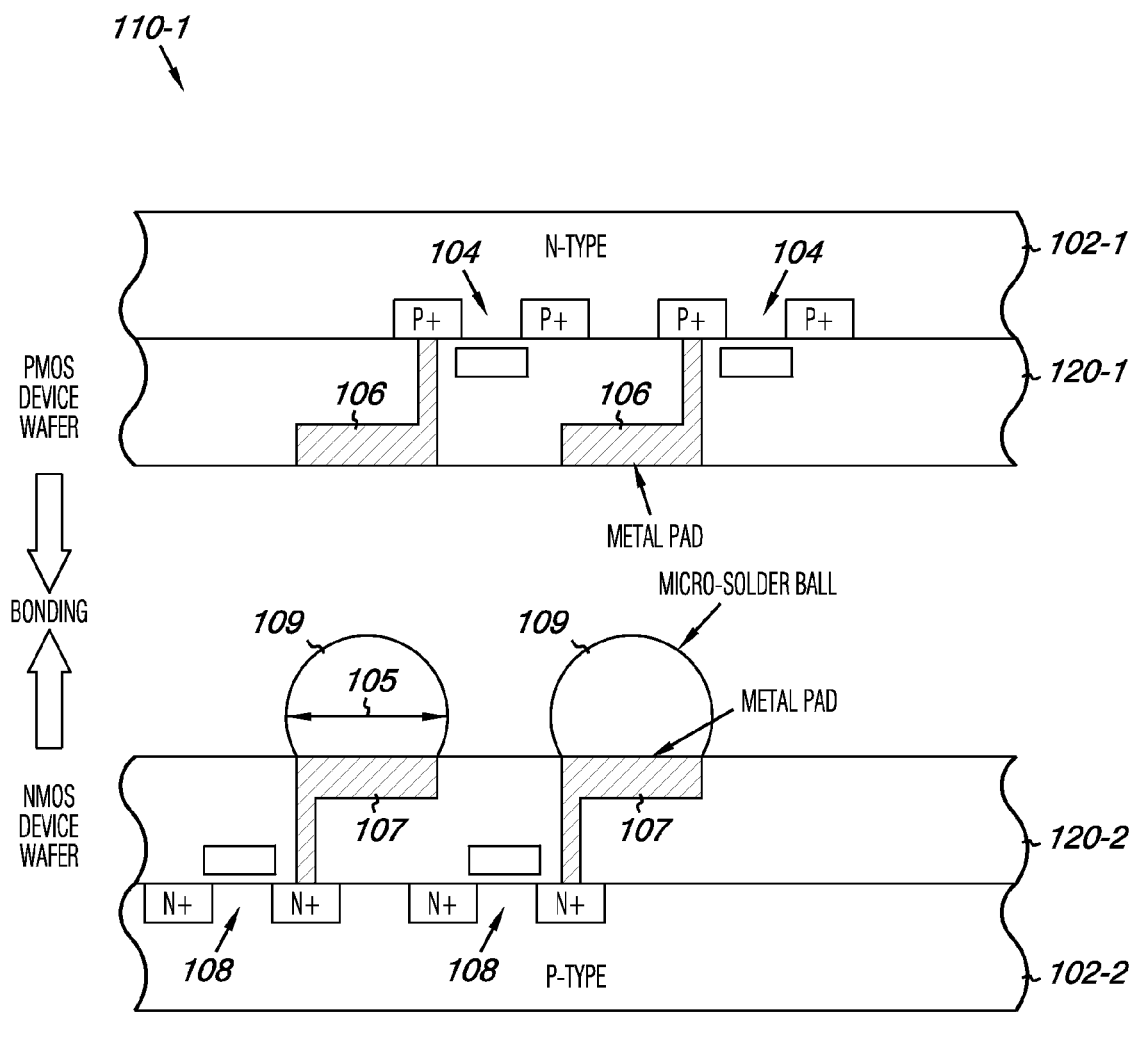
FIG. 1 illustrates a cross-sectional view of a portion of a stacked wafer system according to an embodiment of the present disclosure.

Methods, devices, modules, and systems providing semiconductor devices in a stacked wafer system are described herein. One embodiment includes at least one CMOS device comprising a first wafer having NMOS transistors in a CMOS architecture and a second wafer having PMOS transistors in the CMOS architecture, wherein the first wafer is electrically coupled to the second wafer. Another embodiment includes a DRAM cell comprising a DRAM capacitor on a first wafer and support circuitry associated with the DRAM capacitor on a second wafer, wherein the first wafer is electrically coupled to the second wafer. Another embodiment includes a first wafer having a number of vertical transistors coupled to a bit line and a second wafer having amplifier circuitry associated with the number of vertical transistors, wherein the first wafer is electrically coupled to the second wafer.

In one or more embodiments, the first and second wafer are separately fabricated and subsequently bonded and electrically coupled together with a number of micro joints to form a vertical wafer stack. The micro joints can be a number of reflowable interconnects provided on the first and/or second wafer. In such embodiments, the reflowable interconnects can be solder contacts that can form micro solder bumps. Micro solder bumps may be referred to herein as micro solder balls or micro C4 solder bumps/balls. In various embodiments, the micro solder bumps have a diameter of not greater than 5 microns.

In various embodiments in which the micro joints are micro solder joints, e.g., micro solder balls, the solder can have a relatively low melting point. Providing the micro joints as micro solder joints, e.g., micro solder balls, can provide various benefits. For example, in various embodiments, a wafer stacking system can include more than two wafers in a stack. In some such embodiments, the solder used to form a first solder joint between two wafers in the stack can have a melting point different than the melting point of solder used to form a second solder joint between two wafers in the stack. In such embodiments the solder joint having the lower melting point can be reflowed without disturbing the solder joint having the higher melting point. That is, the use of a solder joint allows for rework if desired, e.g., the solder can be reflowed in order to adjust the positioning of wafers in a bonded wafer stack. Another benefit associated with using a micro solder joint is that the surface tension of the solder can provide the final alignment of the wafers as they are joined.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used in this disclosure, the terms "wafer" and "substrate" are used interchangeably and are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation.

FIG. 1 illustrates a cross-sectional view of a portion of a stacked wafer system according to an embodiment of the present disclosure. The embodiment of FIG. 1 can be used to provide CMOS device logic circuitry and support circuitry in a CMOS architecture. In one or more embodiments, one or more CMOS devices, e.g., CMOS logic gates and or other circuitry, can be provided by bonding and electrically coupling a first wafer 110-1 and a second wafer 110-2 as described in connection with FIG. 1.

In the embodiment illustrated in FIG. 1, the first wafer 110-1 is a PMOS device wafer 110-1 and the second wafer 110-2 is an NMOS device wafer 110-2. As such, the wafer 110-1 includes an N-type substrate layer 102-1 and a dielectric layer 120-1 in which PMOS transistors 104 are formed. The wafer 110-2 includes a P-type substrate layer 102-2 and a dielectric layer 120-2 in which NMOS transistors 108 are formed.

In one or more embodiments, the PMOS device wafer 110-1 does not include any NMOS transistors 108 and the NMOS device wafer 110-2 does not include any PMOS transistors 104. That is, in such embodiments, the wafer 110-1 includes only PMOS transistor circuitry and the wafer 110-2 includes only NMOS transistor circuitry. As such, the wafers 110-1 and 110-2 and devices formed thereon are fabricated separate and apart from each other. Providing the PMOS circuitry used to form one or more CMOS devices on a separate wafer from the NMOS circuitry used to form the CMOS devices can provide various benefits. Such benefits can include, but are not limited to, design flexibility, process simplicity, lower fabrication cost, improved performance, lower power consumption, and/or improved reliability.

For instance, CMOS processes in which NMOS transistors, e.g., 108, and PMOS transistors, e.g., 104, are fabricated on the same wafer can be complicated as compared to separate NMOS and PMOS processes. As one of ordinary skill in the art will appreciate, NMOS processing and PMOS processing can often involve different, and sometimes opposite, process requirements. Examples of such differences include well implants, source/drain implants, gate implants, thermal budgets, transistor channel strain conditions, and gate and gate dielectric materials used to achieve optimum device characteristics, among other differences. These differences can lead to high mask counts and complexity associated with CMOS processing, which can reduce process yield and lead to high chip cost. In contrast, such differences associated with the separate NMOS and PMOS processes can be accommodated by forming CMOS device logic circuitry from PMOS devices, e.g., 104 and NMOS devices, e.g., 108, fabricated on separate wafers. For example, the NMOS transistors 108 can be formed on a (100) wafer and the PMOS transistors 104 can be formed on a (110) wafer, wafer stress can be made tensile on the NMOS device wafer 110-2 and compressive on the PMOS device wafer 110-1, and separate fabrication processes and/or anneal temperatures can be used for the PMOS and NMOS device wafers 110-1 and 110-2.

As one of ordinary skill in the art will appreciate, CMOS devices, such as CMOS logic gates, include one or more PMOS devices, e.g., load devices, connected to one or more NMOS devices, e.g., driver devices, to provide logic functionality. Forming the PMOS devices, e.g., PMOS transistors 104, and the NMOS devices, e.g., NMOS transistors 108, on the same wafer can cause design difficulties due to layout and/or wiring limitations associated with CMOS logic chips. Such limitations are due to factors such as larger gate widths associated with PMOS devices as compared to NMOS devices. Fabricating the NMOS and PMOS devices on separate wafers as described in the embodiment of FIG. 1 reduces or eliminates such limitations and provides increased flexibility in CMOS logic design as compared to prior methods.

As illustrated in the embodiment shown in FIG. 1, the PMOS device wafer 110-1 includes metal bond pads 106 formed in layer 120-1 and the NMOS device wafer 110-2 includes corresponding metal bond pads 107 formed in layer 120-2. As described further below, one or both of the bond pads 106 and 107 can include a reflowable interconnect, e.g., a solder contact, formed thereon. The selection of which of the bond pads 106 and/or 107 to have a solder contact formed thereon can be a matter of process convenience. In the embodiment illustrated in FIG. 1, the bond pads 107 of the NMOS device wafer 110-2 include reflowable interconnects 109 formed thereon. An example of forming the pads 106 and 107 as well as the reflowable interconnects 109 is described in connection with FIGS. 7A-7Q and 8A-8E. In the embodiment shown in FIG. 1, the reflowable interconnects 109 are shown as micro solder balls 109, i.e., the wafer 110-2 has been heated to a reflow temperature such that the solder contacts have formed micro solder balls 109 having a diameter 105. The micro solder balls 109 can have a diameter 105 of about 0.1 microns, 0.5 microns, 1 micron, 5 microns, 20 microns, etc. Embodiments are not limited to these examples, i.e., the micro solders balls 109 are not limited to a particular size and/or diameter 105.

The number of bond pads 106 and 107 provided can depend on the number of terminals of the devices being bonded and electrically coupled together. For example, there can be a bond pad provided for each terminal of a CMOS device or circuit to be formed by the bonding and electrically coupling of PMOS device wafer 110-1 and NMOS device wafer 110-2. One or more "common" pads can be used to reduce the number of pads per device. As an example, a number of two terminal devices formed in a wafer can each have one terminal connected to a common pad. In the embodiment illustrated in FIG. 1, each transistor 104 is shown as being coupled to a pad 106 via a source/drain terminal, e.g., a P+ diffusion region, and each transistor 108 is coupled to a pad 107 via a source/drain terminal, e.g., an N+ diffusion region. In this embodiment, the other source/drain terminal and/or the gates of the transistors 104 and 108 can be coupled to common pads (not shown in FIG. 1).

The bond pads 106 and 107 are formed on the respective wafers 110-1 and 110-2 prior to stacking, i.e., prior to the wafers 110-1 and 110-2 being vertically aligned and face to face bonded and electrically coupled together. The solder contacts, e.g., 109, are also formed prior to stacking.

To help insure proper location of the various bond pads and solder contacts, an initial alignment reference scheme can be used. As an example, complementary coarse alignment structures can be formed on the surfaces of wafers that are going to be vertically stacked and interconnected, e.g., 110-1 and 110-2, prior to formation of the bond pads 106 and 107 and/or prior to formation of the active devices, e.g., transistors 104 and 108. An example of the complementary coarse alignment structures can include a number of vertical depressions, e.g., crystallographic "pits," formed in the surface of one of the wafers, e.g., 110-1 and a corresponding number of vertical protrusions, e.g., crystallographic "tips," formed in the surface of the other wafer, e.g., 110-2. The pits can be formed via an anisotropic etching process using a mask of appropriate geometry and location. The tips can be formed via a process such as selective epitaxy. The complementary tips and pits on the opposing surfaces of the wafers to be vertically stacked and bonded, e.g., 110- and 110-2, can be used to enable effective interconnection of the NMOS devices, e.g., 108, and PMOS devices, e.g., 104, to form one or more CMOS devices.

Figure 12A:
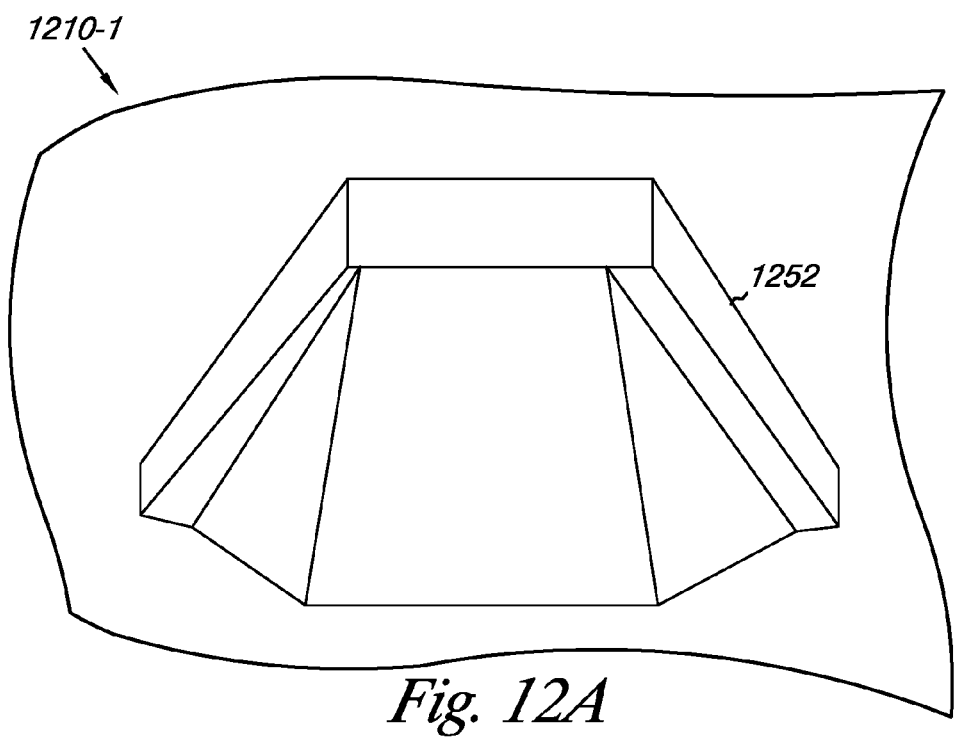
FIGS. 12A-12B illustrate a coarse alignment scheme that can be used with one or more stacked wafer system embodiments of the present disclosure.
Figure 12B:
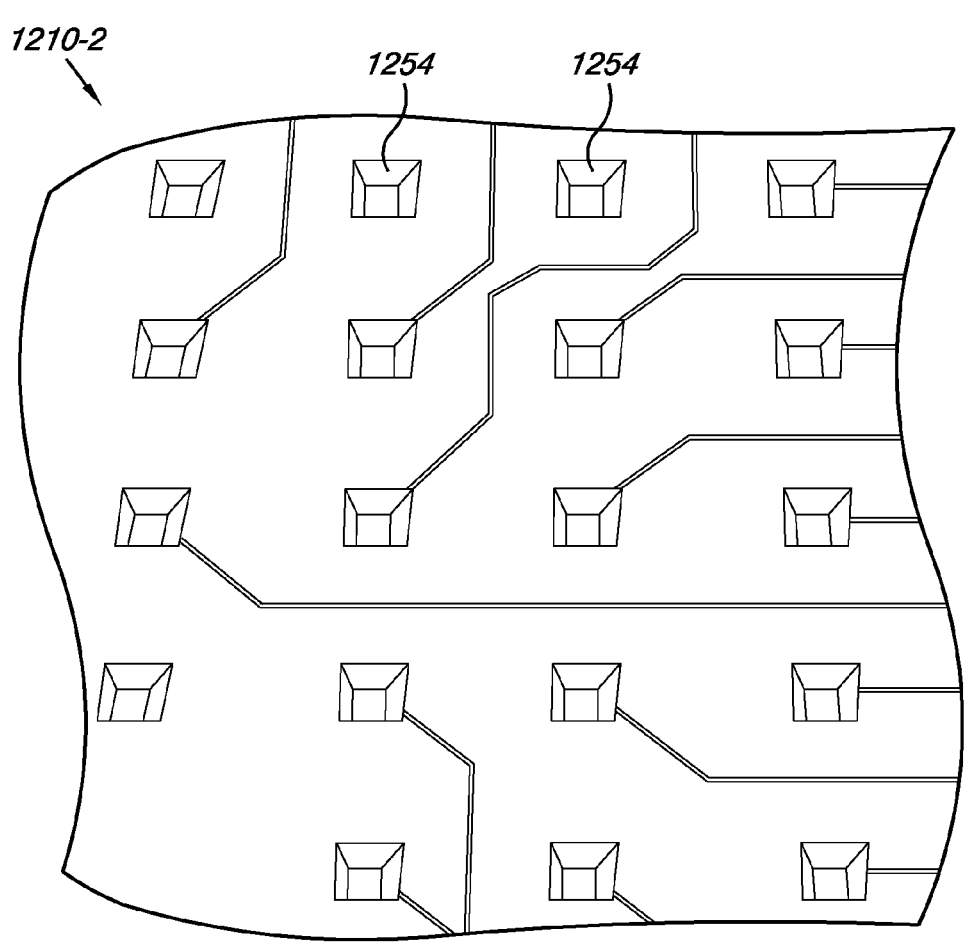

One example of a coarse alignment scheme using complementary coarse alignment structures is described below in connection with FIGS. 12A and 12B. FIG. 12A illustrates a tip 1252 on the surface of a first wafer to be stacked in accordance with an embodiment of the present disclosure. FIG. 12B illustrates a number of pits 1254 on the surface of a second wafer to be stacked in accordance with an embodiment of the present disclosure.

In one or more embodiments, the locations of the bond pads 106 and 107 and interconnects 109 on the wafers is determined based on the above initial coarse alignment reference scheme. This can provide relative alignment of the bond pads 106 and corresponding bond pads 107 when the opposing surfaces of the wafers 110-1 and 110-2 are bonded face to face as the pits on one surface receive the complementary tips on the opposing surface. In this manner, the solder contacts 109 formed on bond pads 107 can be relatively aligned with the complementary pads 106 when the opposing surfaces are brought together. When the wafers 110-1 and 110-2 are heated to a reflow temperature associated with the solder contacts 109, the contacts reflow to form the solder balls 109. The solder balls 109 provide a meniscus surface tension force which can further align the appropriate complementary bond pads 107 and 106 of wafers 110-2 and 110-1, respectively. The further alignment provided by the surface tension force associated with micro solder balls 109 can be referred to herein as fine alignment. In this manner, the initial coarse alignment and the fine alignment processes can bring appropriate pads of the wafers 110-1 and 110-2 into increased alignment as compared to other vertical wafer stacking approaches while forming a physical bond and electrical connection via the micro solder balls 109.

In the embodiment illustrated in FIG. 1, the micro solder balls 109 are formed on the pads 107 of the NMOS device wafer 110-2. However, reflowable interconnects, e.g., solder contacts which become micro solder balls 109 upon reflow, could alternatively be formed on pads 106 or could be formed on both the pads 107 and pads 106. Also, in one or more embodiments, the solder contacts can be a composite of a plated solder material and one or more metallization layers that can alloy together upon reflow. In such embodiments, the alloyed material can have a higher melting point after reflow which can allow for subsequent stacking of additional wafers at the same reflow temperature. For instance, a third wafer can be bonded and electrically coupled to the CMOS device wafer, i.e., the bonded stack of wafers 110-1 and 110-2, by using reflowable solder contacts, e.g., 109, without losing the bond between wafers 110-1 and 110-2.

In one or more embodiments, an underfill process may be performed on the wafers 110-1 and 110-2 after bonding via the micro solder balls 109. For example, a material such as Parylene can be used to fill narrow spaces between solder balls 109 after bonding. The underfill process may improve the mechanical integrity of the vertically stacked wafers 110-1 and 110-2.

In the embodiment illustrated in FIG. 1, the first wafer 110-1 and the second wafer 110-2 are bonded face to face. As one of ordinary skill in the art will appreciate, contact to the devices and/or interconnections of the bonded wafers 110-1 and 110-2 can be made by using through wafer connections. Such through wafer connections can be accomplished by using buried conductors formed in the wafers early in the fabrication process that can be connected via contact studs extending vertically into the wafer. After the wafers are joined, the back of the wafers can be polished back to expose the contact studs. Additional solder balls can be applied to the back surface of the wafer having the exposed contact studs for bonding and/or electrical connection to additional devices and/or circuitry. Other known methods of forming through wafer connections can also be used.

In some embodiments, memory can be incorporated into a system on a chip by bonding, for example, storage capacitors at appropriate locations on one or both of the PMOS device wafer 110-1 and the NMOS device wafer 110-2. Also, the CMOS devices formed from bonding and electrically coupling the wafers 110-1 and 110-2 can be incorporated into various electronic devices including cellular phones, music players, and/or digital assistants by bonding using micro solder balls, e.g., 109.

Figure 2:
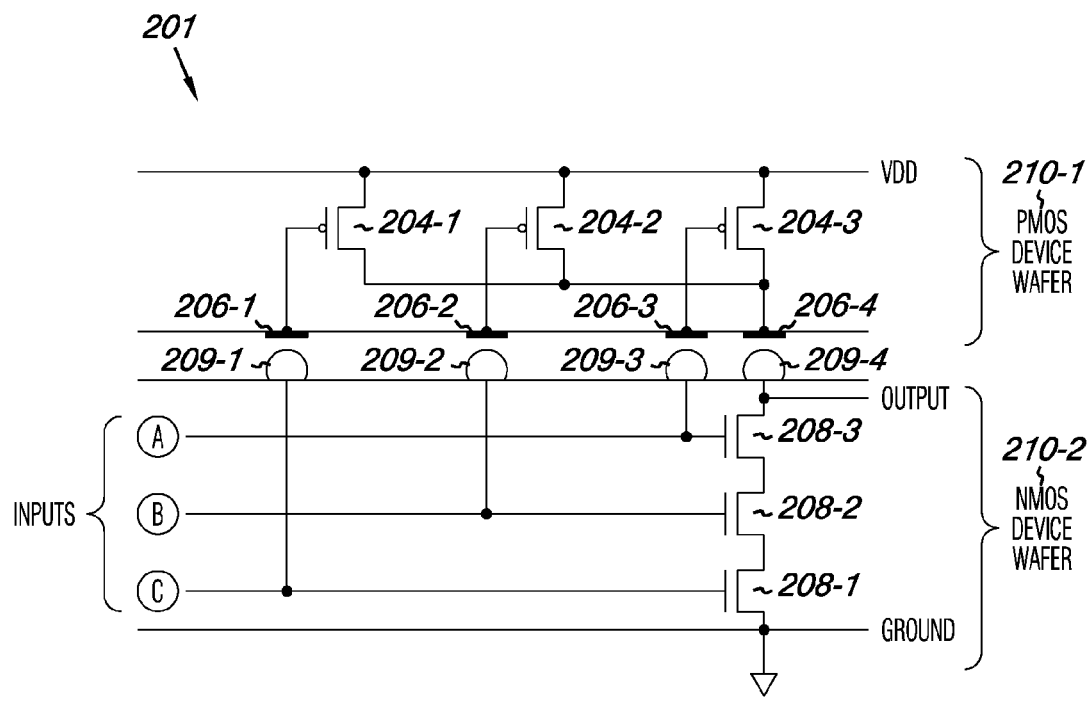
FIG. 2 illustrates an example of a logic circuit formed in accordance with the embodiment illustrated in FIG. 1.

FIG. 2 illustrates an example of a logic circuit 201 formed in accordance with the embodiment illustrated in FIG. 1. The logic circuit 201 shown in FIG. 2 is a CMOS logic gate 201 formed via bonding and electrical coupling of a PMOS device wafer 210-1 to an NMOS device wafer 210-2 via micro solder balls 209-1, 209-2, 209-3, and 209-4. As described in connection with FIG. 1, the transistors formed on the PMOS device wafer 210-1, e.g., PMOS transistors 204-1, 204-2, and 204-3, are formed separately from the transistors formed on the NMOS device wafer 210-2, e.g., NMOS transistors 208-1, 208-2, and 208-3.

In the embodiment illustrated in FIG. 2, the CMOS logic circuit 201 is a 3-input NAND gate 201, however, embodiments are not limited to a particular type of CMOS logic circuit. As shown in FIG. 2, the PMOS circuitry of wafer 210-1 is bonded and electrically coupled to the NMOS circuitry of wafer 210-2 via four solder balls 209-1, 209-2, 209-3, and 209-4 formed on wafer 210-2 coupled to four complementary bonding pads 206-1, 206-2, 206-3, and 206-4 formed on wafer 210-1. Three solder balls, i.e., 209-1, 209-2, and 209-3, are used to electrically couple the gates of NMOS transistors 208-1, 208-2, and 208-3 to the gates of the PMOS transistors 204-1, 204-2, and 204-3, respectively, to provide the three inputs (shown as A, B, and C) of the NAND gate 201. The fourth solder ball 209-4 is bonded to pad 206-4 to provide the output of the NAND gate 201.

In one or more embodiment of the present disclosure, the size of the NAND gate 201 is about 8 F×10 F, where "F" is the feature size. Therefore, the NAND gate 201 formed by bonding and electrically coupling the separately fabricated PMOS device wafer 210-1 and NMOS device wafer 210-2 according to embodiments of the present disclosure can have a reduced gate size as compared to previous 3-input NAND gates fabricated according to a CMOS process. The gate size of a 3 input NAND gate fabricated by such CMOS processes, in which the NMOS and PMOS transistors are fabricated on the same wafer, can be about 16 F×20 F.

Figure 3:
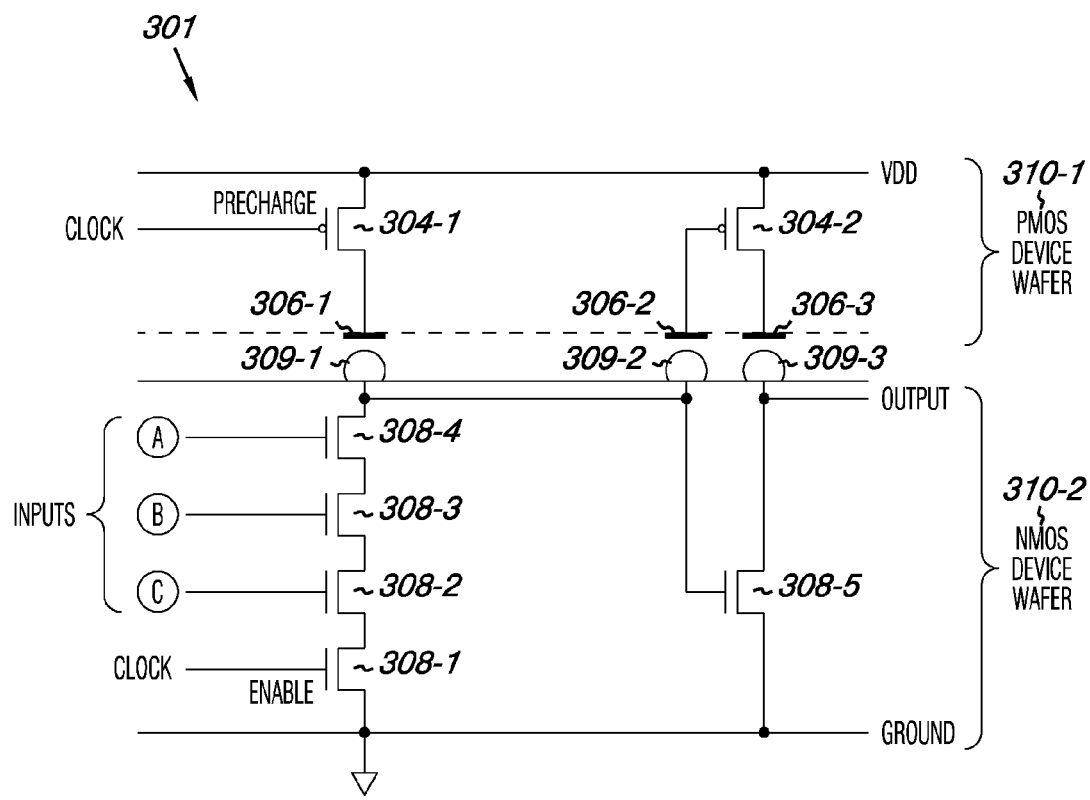
FIG. 3 illustrates another example of a logic circuit formed in accordance with the embodiment illustrated in FIG. 1.

FIG. 3 illustrates another example of a logic circuit 301 formed in accordance with the embodiment illustrated in FIG. 1. The logic circuit 301 shown in FIG. 3 is a CMOS logic gate 301 formed via bonding and electrical coupling of a PMOS device wafer 310-1 to an NMOS device wafer 310-2 via micro solder balls 309-1, 309-2, and 309-3. As described in connection with FIG. 1, the transistors formed on the PMOS device wafer 310-1, e.g., PMOS transistors 304-1, and 304-2, are formed separately from the transistors formed on the NMOS device wafer 310-2, e.g., NMOS transistors 308-1, 308-2, 308-3, 308-4, and 308-5.

In the embodiment illustrated in FIG. 3, the CMOS logic circuit 301 is a 3-input NAND CMOS domino logic gate 301, however, embodiments are not limited to a particular type of CMOS logic circuit. As shown in FIG. 3, the PMOS circuitry of wafer 310-1 is bonded and electrically coupled to the NMOS circuitry of wafer 310-2 via three solder balls 309-1, 309-2, and 309-3 formed on wafer 310-2 coupled to three complementary bonding pads 306-1, 306-2, and 306-3 formed on wafer 310-1. That is, in this embodiment, only three micro solder balls, i.e., 309-1, 309-2, and 309-3, are used to form the gate 301.

Embodiments of the present disclosure are not limited to the examples shown in FIGS. 2 and 3. That is, the embodiment illustrated in FIG. 1 can be used to form various other CMOS devices in which the PMOS devices, e.g., load devices, and NMOS devices, e.g., driver devices, are formed on separate wafers. For instance, in one or more embodiments, the embodiment illustrated in FIG. 1 is used to form CMOS building blocks such as cell libraries, programmable logic arrays (PLAs), and/or static random access memory (SRAM) arrays, among other CMOS building blocks for use in micro-processors, digital signal processors (DSPs), and/or for systems on a chip.

As an example, an array of SRAM cells, e.g., an embedded cache array and/or stand-alone array, can be formed in accordance with the embodiment illustrated in FIG. 1. An SRAM cell that can be formed in accordance with the embodiment of FIG. 1 is illustrated and described below in connection with FIG. 11. In such embodiments, forming the PMOS and NMOS elements of an SRAM cell on separate wafers can provide benefits such as improved scalability, design flexibility, and/or performance as compared to SRAM arrays in which the PMOS and NMOS elements of the SRAM cells are fabricated together on the same wafer. For instance, forming the PMOS and NMOS elements on separate wafers can allow the PMOS and NMOS elements to be separately performance optimized as described above, which can lead to reduction or elimination of latch-up considerations, among other benefits. As such, SRAM cells and/or SRAM arrays formed in accordance with embodiments of the present disclosure can be designed within processors and/or systems on a chip and can have improved functional characteristics as compared to SRAM cells having PMOS and NMOS elements formed on the same wafer.

Figure 4:
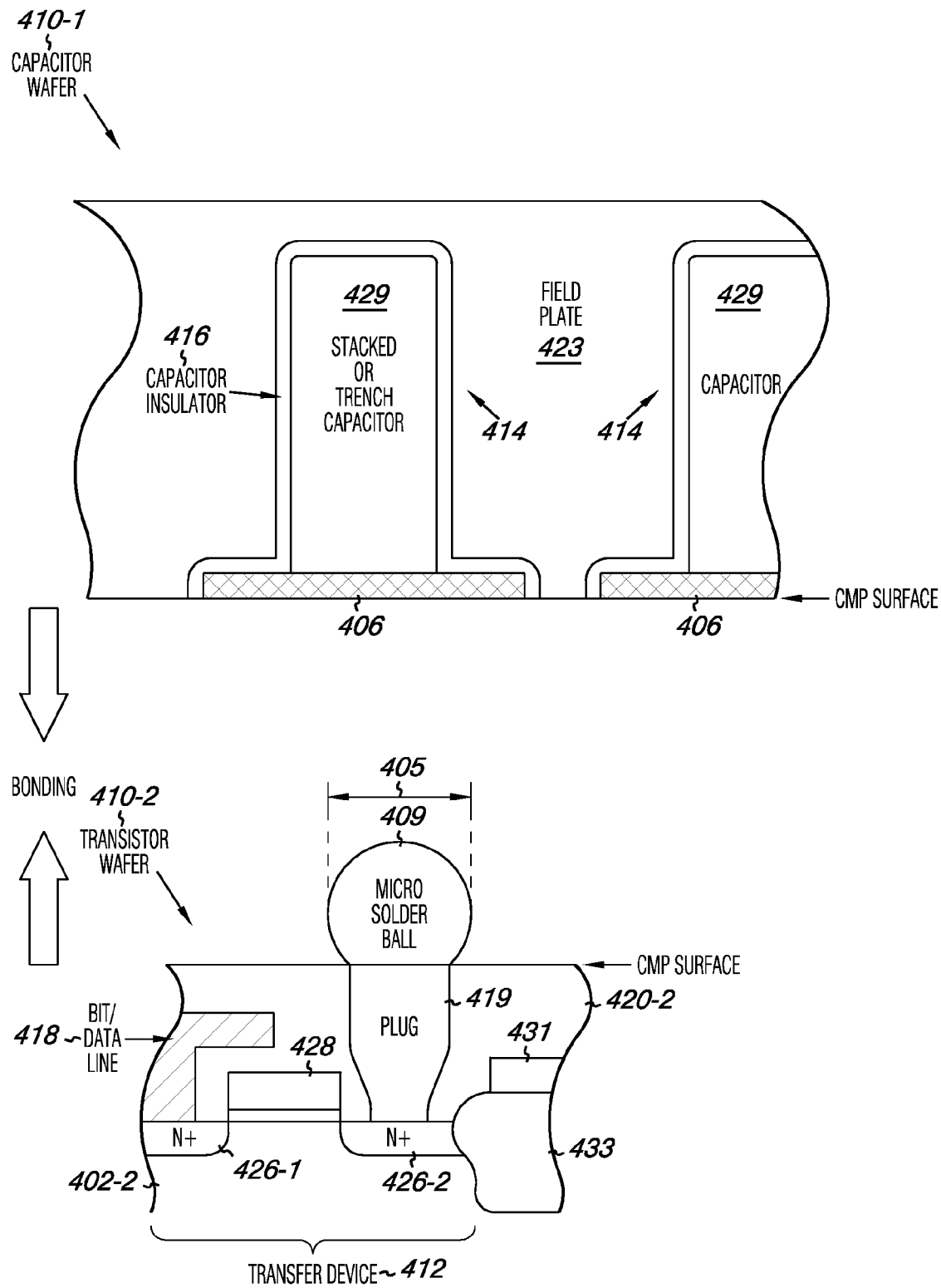
FIG. 4 illustrates a cross-sectional view of a portion of a stacked wafer system according to an embodiment of the present disclosure.

FIG. 4 illustrates a cross-sectional view of a portion of a stacked wafer system according to an embodiment of the present disclosure. The embodiment of FIG. 4 can be used to provide a number of DRAM cells formed by bonding and electrically coupling a first wafer 410-1 having a number of DRAM storage capacitors formed thereon and a second wafer 410-2 having support circuitry associated with the number of storage capacitors, e.g., DRAM transistors, bit lines, word lines, and passing word lines of a memory device, formed thereon. The number of DRAM capacitors can be an array of DRAM capacitors used to form an array of DRAM cells.

In the embodiment illustrated in FIG. 4, the first wafer 410-1, i.e., the capacitor wafer 410-1, is fabricated separately and apart from the second wafer 410-2, i.e., the transistor wafer 410-2. As such, the storage capacitors 414 used to form DRAM cells are fabricated on a different wafer, e.g., 410-1, than the transistors 412 used to form the DRAM cells. In one or more embodiments, the capacitor wafer 410-1 does not include any DRAM transistors 412 and the transistor wafer 410-2 does not include any DRAM storage capacitors 414.

Forming the DRAM capacitors 414 and DRAM transistors 412 on different wafers can provide various benefits over various integration schemes in which DRAM capacitors and DRAM transistors are fabricated on the same wafer. For instance, such integration schemes can be complex and/or challenging as compared to embodiments of the present disclosure. As an example, many capacitor dielectrics, e.g., high K dielectrics, can have limited endurance to high temperature anneals and processing used to provide transistor device stability. Therefore, the capacitor dielectric materials can be degraded due to such high temperature anneals and processing occurring after fabrication of the capacitors. Various embodiments of the present disclosure can effectively integrate DRAM storage capacitors formed on a first wafer with the transistor portion of a DRAM cell and associated support circuitry formed on a separate wafer in a vertically stacked manner without compromising the integrity and reliability of the capacitor.

In one or more embodiments, and as illustrated in FIG. 4, the storage capacitors 414 can be stacked capacitors or trench capacitors. In various embodiments, at least one of the capacitors 414 is a trench capacitor.

In the embodiment shown in FIG. 4, the capacitor 414 includes a capacitor insulator 416, i.e., a capacitor dielectric 416, between the storage nodes 429 and a field plate 423. The storage node 429 can be a material such as a doped polysilicon material. In one or more embodiments, the dielectric 416 can be a high dielectric constant, i.e., high K, material such as BST (barium strontium titanate) or AZTT (amorphous zirconium tin titanate), among other high K materials.

As shown in FIG. 4, the wafer 410-1 includes metal bond pads 406. The bond pads 406 can be used to bond and electrically couple a DRAM capacitor 414 to a DRAM transfer device 412, i.e., FET (field-effect transistor) 412, to form a DRAM cell element. As shown in FIG. 4, the surface of wafer 410-1 containing bond pads 406, i.e., the surface to be face to face bonded to an opposing surface of wafer 410-2, has been chemically mechanically polished, i.e., the surface is a CMP surface.

Embodiments of the present disclosure are not limited to capacitors of a particular type or structure. For instance, in various embodiments the capacitor wafer 410-1 can include capacitors having a structure other than that of capacitor 414 shown in FIG. 4. In such embodiments, the storage capacitors formed on wafer 410-1 can be fabricated by various methods known in the art.

In the embodiment illustrated in FIG. 4, the wafer 410-2 includes a substrate layer 402-2 and a dielectric layer 420-2. The substrate layer 402-2 is a P-type silicon layer, although embodiments are not so limited. The wafer 410-2 is referred to as the "transistor wafer" 410-2 in FIG. 4 because it includes a transistor 412 which forms a DRAM cell element when wafer 410-2 is bonded and electrically coupled to wafer 410-1, i.e., when the DRAM transistor 412 and DRAM capacitor 414 are electrically coupled. The transistor 412 includes N+ diffusion regions 426-1 and 426-2, which serve as the source and drain of transistor 412, and a gate 428.

In one or more embodiments, the transistor wafer 410-2 also includes various support circuitry associated with a DRAM architecture. For example, in the embodiment illustrated in FIG. 4, the wafer 410-2 includes a bit line 418 (shown as BIT/DATA LINE) and a passing word line 431 associated with a DRAM array. The passing word line 431 is formed above an isolation region 433. The wafer 410-2 can include various other support circuitry not shown in FIG. 4. Such support circuitry can include logic circuits including transistors other than the DRAM transistors 412.

In the embodiment illustrated in FIG. 4, the wafer 410-2 includes a metal plug 419 connected to diffusion region 426-2 of the DRAM transistor 412. In the embodiment illustrated in FIG. 4, a reflowable interconnect, e.g., a solder contact, is formed on the plug 419, i.e., on the CMP surface of wafer 410-2. In some embodiments, the plug material of plug 419 can be solderable and can have a low solubility in the solder. In some such embodiments, the reflowable interconnect, e.g., solder contact 409, can be directly deposited upon the plug 419. In embodiments in which the plug 419 is not solderable, an appropriate solder pad can be used.

To bond and electrically couple the plug 419 to pad 406, i.e., to electrically couple capacitor 414 and transistor 412, the wafer 410-2 can be heated to a reflow temperature of the solder contact to form a micro solder ball 409 having a diameter 405. The micro solder ball 409 can be formed via a process such as that described in connection with FIGS. 7A-7Q and 8A-8E. In various embodiments, the diameter 405 can is less than 5 microns. In one or more embodiments, the diameter 405 is less than 2 microns.

The positioning of the solder ball 409 on wafer 410-2 and the positioning of pad 406 on wafer 410-1 can be based on a coarse alignment scheme such as that described in connection with FIG. 1. For instance the coarse alignment scheme can be used to position solder ball 409 on plug 419 so as to align with the appropriate bonding pad 406 of wafer 410-1 when the wafers 410-1 and 410-2 are bonded and electrically coupled together. Although a single micro solder ball 409 is shown in FIG. 4, the reader will appreciate that the number of solder ball contacts 409 depends, at least partially, on the number of DRAM cells to be formed by bonding wafers 410-1 and 410-2.

In the embodiment illustrated in FIG. 4, the micro solder balls 409 are formed on the plugs 419 transistor wafer 410-2. However, reflowable interconnects, e.g., solder contacts which become micro solder balls 409 upon reflow, could alternatively be formed on pads 406 or could be formed on both the pads 406 and plugs 419. Also, in one or more embodiments, the solder contacts can be a composite of a plated solder material and one or more metallization layers that can alloy together upon reflow. In such embodiments, the alloyed material can have a higher melting point after reflow which can allow for subsequent stacking of additional wafers at the same reflow temperature. For instance, a third wafer can be bonded and electrically coupled to the bonded vertical stack of wafers 410-1 and 410-2 by using reflowable solder contacts, e.g., 409, without losing the bond between wafers 410-1 and 410-1. An underfill process as described above can be used to improve the mechanical integrity of the vertically stacked wafers 410-1 and 410-2.

As one of ordinary skill in the art will appreciate, contact to the devices and/or interconnections of the bonded wafers 410-1 and 410-2 can be made by using through wafer connections as described above in connection with FIG. 1 and/or by various other methods known by those of ordinary skill in the art. In one or more embodiments, a DRAM capacitor wafer such as 410-1 can be bonded on a processor wafer in order to form a cache memory having many fewer transistors than SRAM cache memories. In one or more embodiments, DRAM can be incorporated into a system on a chip by bonding a capacitor wafer such as 410-1 to a system chip. DRAM memory formed in accordance with one or more embodiments of the present disclosure can be incorporated into various electronic devices including cellular phones, music players, and/or digital assistants by bonding using micro solder balls, e.g., 409.

Figure 5:
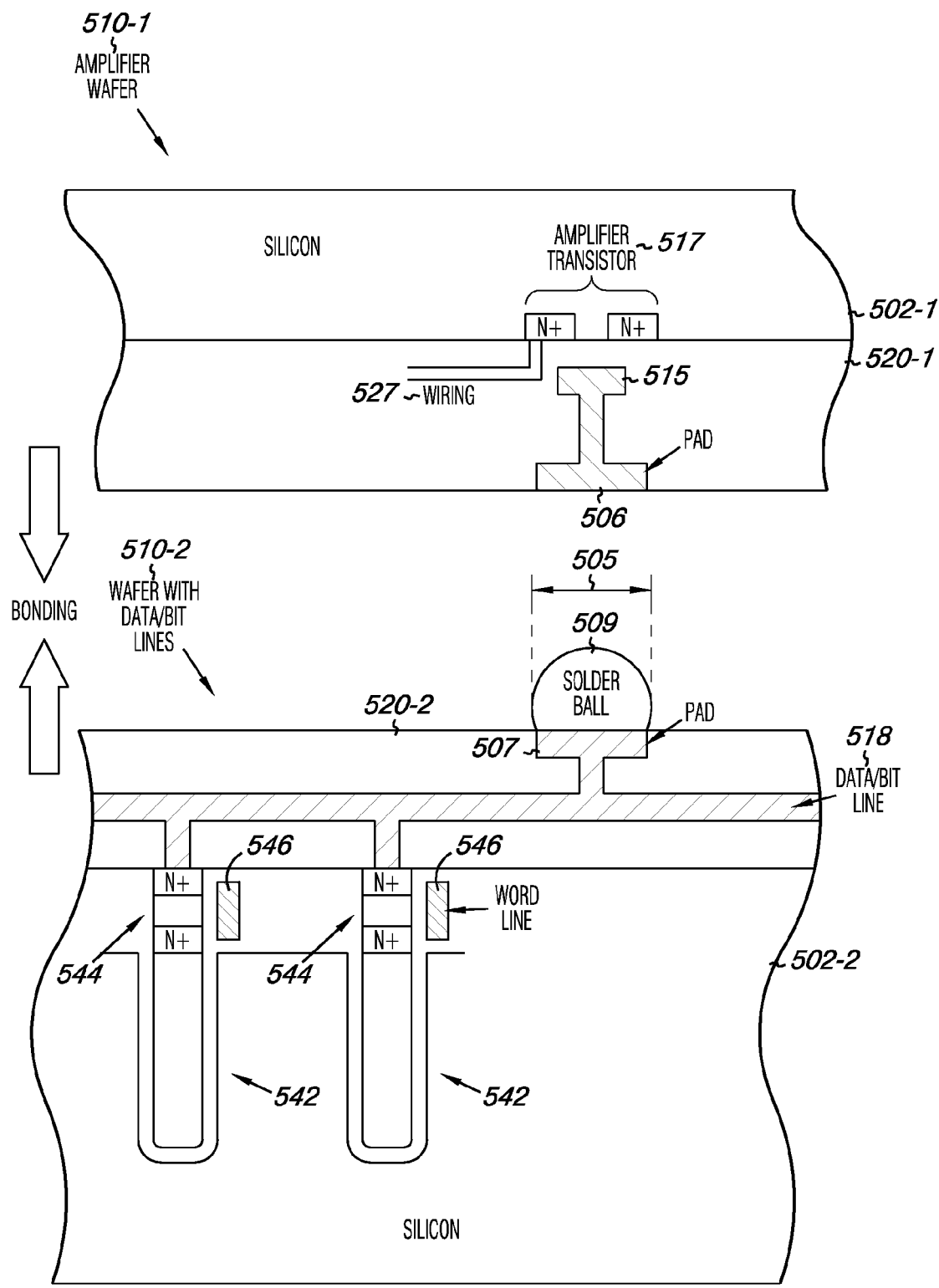
FIG. 5 illustrates a cross-sectional view of a portion of a stacked wafer system according to an embodiment of the present disclosure.

FIG. 5 illustrates a cross-sectional view of a portion of a stacked wafer system according to an embodiment of the present disclosure. One or more embodiments of the present disclosure provide a stacked wafer system that includes a first wafer bonded and electrically coupled to a second wafer. The wafers can be aligned and vertically stacked and can be bonded via a number of wafer to wafer interconnects, e.g., reflowable interconnects such as micro solder contacts, as described herein. The stacked wafer system can be associated with various types of electronic devices and systems having memory arrays and/or logic arrays. Examples of memory arrays include DRAM, SRAM, flash, and NROM arrays, among various other types of memory arrays. Examples of logic arrays include programmable logic arrays and decode circuits, among others. Both memory arrays and logic arrays can include associated amplifier circuitry. For instance, various memory arrays have amplifier circuitry that includes sense amplifiers used to sense data lines, e.g., bit lines, associated with the array in order to determine states of memory cells of the memory array.

The embodiment of FIG. 5 illustrates an example of a stacked wafer system associated with a memory array. However, embodiments are not limited to the example shown in FIG. 5. In one or more embodiments, a stacked wafer system, such as that shown in the embodiment of FIG. 5, can be used to provide an array of vertical transistor memory cells in which the amplifier circuitry associated with the array of memory cells is fabricated on a different wafer than the array of memory cells. In one or more embodiments, the wafer, e.g., wafer 510-1, having the amplifier circuitry can be bonded and electrically coupled to the wafer, e.g., 510-2, having the array of vertical transistor memory cells via a process such as that described in connection with FIGS. 1 and 4.

In the embodiment illustrated in FIG. 5, the wafer 510-1 is an amplifier wafer 510-1 and the wafer 510-2 is a data/bit line wafer 510-2. That is, the wafer 510-1 includes the amplifier circuitry to be bonded and electrically coupled to the vertical transistor memory cells via the data/bit line 518 formed in wafer 510-2. The wafers 510-1 and 510-2 include respective silicon substrate layers 502-1 and 502-2 and respective dielectric layers 520-1 and 520-2. In this embodiment, the silicon layers 502-1 and 502-2 are P-type silicon, but embodiments are not so limited.

In various embodiments, and as shown in FIG. 5, the amplifier circuitry of wafer 510-1 includes a number of planar transistors, e.g., 517, and wiring, e.g., 527, associated with one or more sense amplifiers (not shown in FIG. 5) formed on amplifier wafer 510-1. Although only one amplifier transistor 517 is shown, one of ordinary skill in the art will appreciate that the amplifier circuitry associated with an array of memory cells can include a number of transistors 517.

In the embodiment illustrated in FIG. 5, the wafer 510-2 includes a number of vertical transistors 544 and storage capacitors 542. In this embodiment, the storage capacitors 542 are trench capacitors 542 and are coupled to respective vertical transistors 544 to form DRAM cells, i.e., the trench capacitors 542 and vertical transistors 544 form vertical transistor memory cells with the gates 546 of the vertical transistors being word lines of the memory array. However, embodiments are not limited to this example. For instance, embodiments of the present disclosure can include other types of storage capacitors such as stacked capacitors and other types of memory cells. Also, the capacitors 542 and vertical transistors 544 can have structures other than the structures illustrated in FIG. 5.

In one or more embodiments, the amplifier wafer 510-1 does not include any vertical transistor memory cells and the data/bit line wafer 510-2 does not include any amplifier circuitry, e.g., wiring 527 and transistors 517 associated with sense amplifiers of an array of vertical transistor memory cells. In such embodiments, the wafer 510-1 can include all of the sense amplifiers, e.g., sense amplifier 638 shown in FIG. 6, associated with an array of vertical transistor memory cells, while the wafer 510-2 includes the bit lines, e.g., 518, and the vertical transistor memory cells of the array. As such, the wafers 510-1 and 510-2 and devices formed thereon are fabricated separate and apart from each other.

Fabricating amplifier circuitry associated with an array of vertical memory cells on a wafer separate from the wafer on which the bit lines and vertical transistor memory cells are fabricated, according to embodiments described herein, can provide various benefits. As one example, separately fabricating wafers 510-1 and 510-2 can provide the combined benefits of an increased spacing pitch associated with the planar transistor sense amplifiers formed on wafer 510-1 and of a narrow spacing between bit lines formed on the wafer 510-2, i.e., due to the use of vertical transistor memory cells. For instance, in one or more embodiments, the sense amplifiers formed on wafer 510-1 can have a spacing pitch of greater than about 4 F for a bit line to bit line spacing of 2 F associated with the bit lines formed on wafer 510-2.

As illustrated in the embodiment shown in FIG. 5, the amplifier wafer 510-1 includes metal bond pads 506 formed in layer 520-1 and the bit line wafer 510-2 includes corresponding metal bond pads 507 formed in layer 520-2. In the embodiment illustrated in FIG. 5, the bond pad 506 is coupled to a gate 515 of the amplifier transistor and the bond pad 507 is coupled to an N+ diffusion region, e.g., source/drain region, of a number of vertical transistors 544 via bit line 518. As described above in connection with the embodiments of FIGS. 1 and 4, one or both of the bond pads 506 and 507 can include a reflowable interconnect, e.g., a solder contact, formed thereon. The selection of which of the bond pads 506 and/or 507 to have a solder contact formed thereon can be a matter of process convenience. In the embodiment illustrated in FIG. 5, the bond pads 507 of wafer 510-2 include reflowable interconnects 509 formed thereon. An example of forming the pads 506 and 507 as well as the reflowable interconnects 509 is described in connection with FIGS. 7A-7Q and 8A-8E. In the embodiment shown in FIG. 5, the reflowable interconnects 509 are shown as micro solder balls 509, i.e., the wafer 510-2 has been heated to a reflow temperature such that the solder contacts have formed micro solder balls 509 having a diameter 505. The micro solder balls 509 can have a diameter 505 of about 0.1 microns, 0.5 microns, 1 micron, 5 microns, 20 microns, etc. Embodiments are not limited to these examples, i.e., the micro solders balls 509 are not limited to a particular size and/or diameter 505.

The bond pads 506 and 507 are formed on the respective wafers 510-1 and 510-2 prior to stacking, i.e., prior to the wafers 510-1 and 510-2 being vertically aligned and face to face bonded and electrically coupled together. The solder contacts, e.g., 509, are also formed prior to stacking. To help insure proper location of the various bond pads and solder contacts, an initial alignment reference scheme such as that described in FIG. 1 above, can be used. In one or more embodiments, the locations of the bond pads 506 and 507 and interconnects 509 on the wafers can be determined based on the above initial coarse alignment reference scheme. This can provide relative alignment of the bond pads 506 and corresponding bond pads 507 when the opposing surfaces of the wafers 510-1 and 510-2 are bonded face to face.

When the wafers 510-1 and 510-2 are heated to a reflow temperature associated with the solder contacts 509, the contacts reflow to form the solder balls 509. The solder balls 509 provide a meniscus surface tension force which can further align the appropriate complementary bond pads 507 and 506 of wafers 510-2 and 510-1, respectively.

In the embodiment illustrated in FIG. 5, the micro solder balls 509 are formed on the pads 507 of the bit line wafer 510-2. However, reflowable interconnects, e.g., solder contacts which become micro solder balls 509 upon reflow, could alternatively be formed on pads 506 or could be formed on both the pads 507 and pads 506. Also, in one or more embodiments, the solder contacts can be a composite of a plated solder material and one or more metallization layers that can alloy together upon reflow. In such embodiments, the alloyed material can have a higher melting point after reflow which can allow for subsequent stacking of additional wafers at the same reflow temperature. For instance, a third wafer can be bonded and electrically coupled to the bonded stack of wafers 510-1 and 510-2, by using reflowable solder contacts, e.g., 509, without losing the bond between wafers 510-1 and 510-2. An underfill process, such as that described above in connection with FIG. 1, may be performed on the wafers 510-1 and 510-2 after bonding via the micro solder balls 509.

In the embodiment illustrated in FIG. 5, the first wafer 510-1 and the second wafer 510-2 are bonded face to face. As one of ordinary skill in the art will appreciate, contact to the devices and/or interconnections of the bonded wafers 510-1 and 510-2 can be made by using through wafer connections. Such through wafer connections can be accomplished by using buried conductors formed in the wafers early in the fabrication process that can be connected via contact studs extending vertically into the wafer. After the wafers are joined, the back of the wafers can be polished back to expose the contact studs. Additional solder balls can be applied to the back surface of the wafer having the exposed contact studs for bonding and/or electrical connection to addition devices and/or circuitry. Other known methods of forming through wafer connections can also be used.

Figure 6:
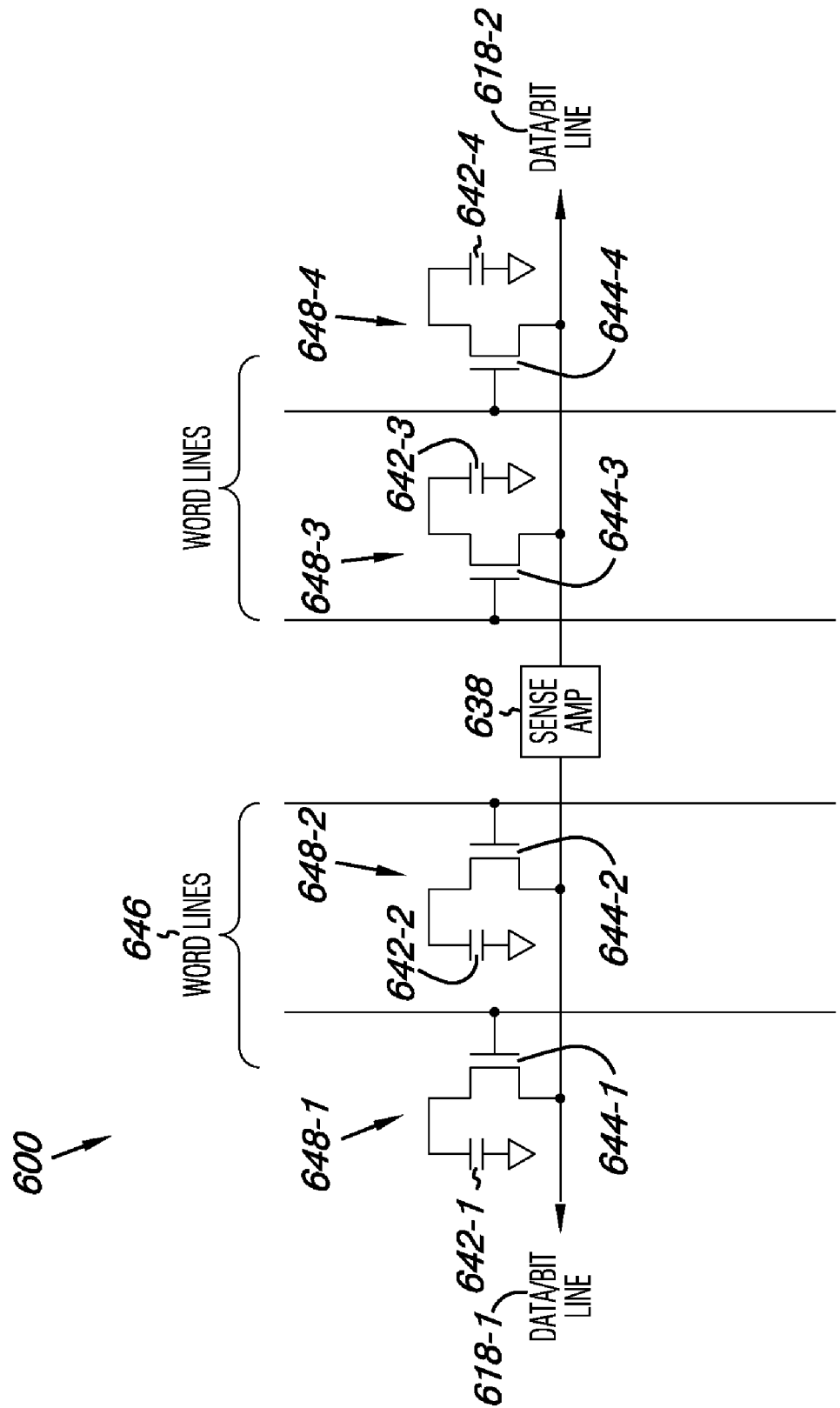
FIG. 6 illustrates a portion of a memory device formed in accordance with the embodiment illustrated in FIG. 5.

FIG. 6 illustrates a portion of a memory device 600 formed in accordance with the embodiment illustrated in FIG. 5. The embodiment illustrated in FIG. 6 includes a number of memory cells 648-1, 648-2, 648-3, and 648-4 coupled to a sense amplifier 638 via complement data bit lines 618-1 and 618-2 arranged in an open bit line architecture. In this embodiment, the memory cells are DRAM memory cells 648-1, 648-2, 648-3, and 648-4 having respective storage capacitors 642-1, 642-2, 642-3, and 642-4 and vertical transistors 644-1, 644-2, 644-3, and 644-4. The gates of the vertical transistors are coupled to word lines 646. A source/drain region of vertical transistors 644-1 and 644-2 is coupled to bit line 618-1 and a source/drain region of vertical transistors 644-3 and 644-4 is coupled to bit line 618-2.

In one or more embodiments, the sense amplifier 638 can be fabricated on a different wafer than the wafer on which the bit lines 418-1 and 418-2 and the vertical transistor memory cells 648-1, 648-2, 648-3, and 648-4 are fabricated. In such embodiments, the amplifier wafer and bit line wafer can be vertically aligned, bonded, and electrically coupled via one or more micro solder balls as described herein.

Figure 7A:
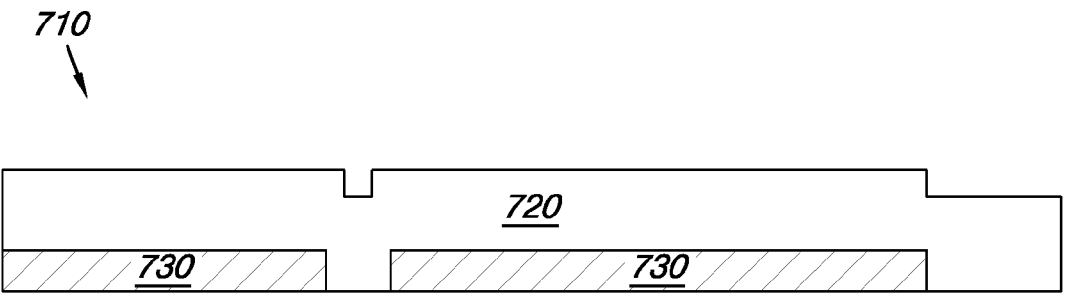
FIGS. 7A-7Q are cross-sectional views illustrating formation of wafer to wafer interconnects that can be used with one or more embodiments of the present disclosure.
Figure 7B:
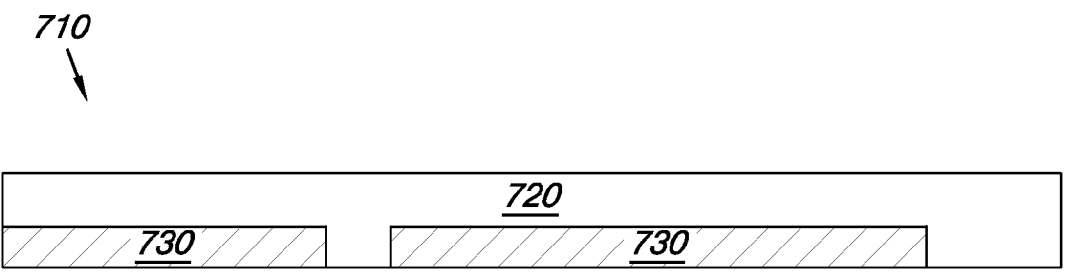
Figure 7C:
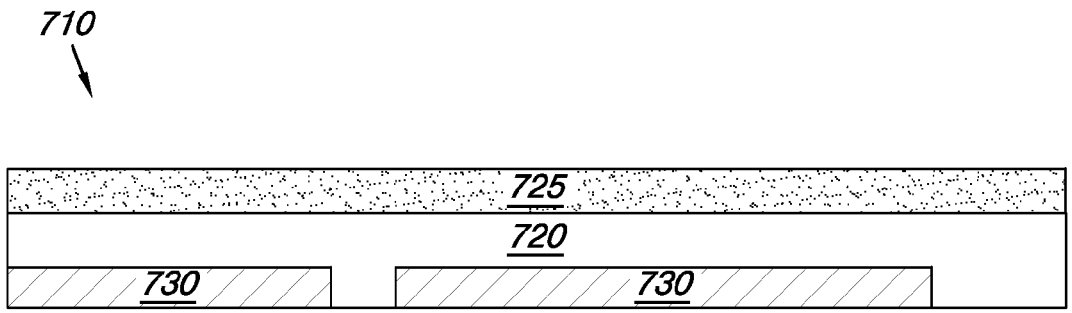
Figure 7D:
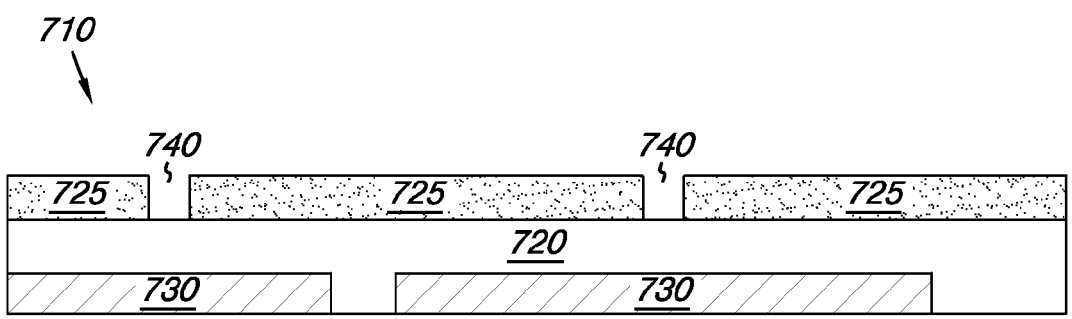
Figure 7E:
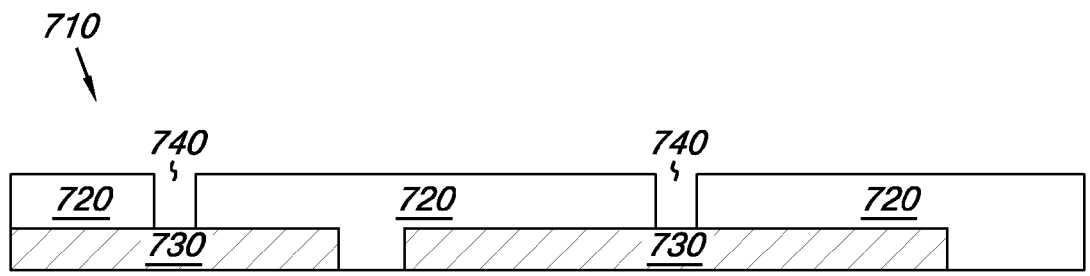
Figure 7F:
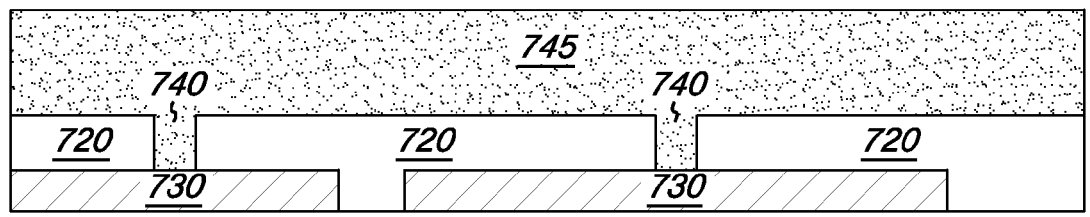
Figure 7G:
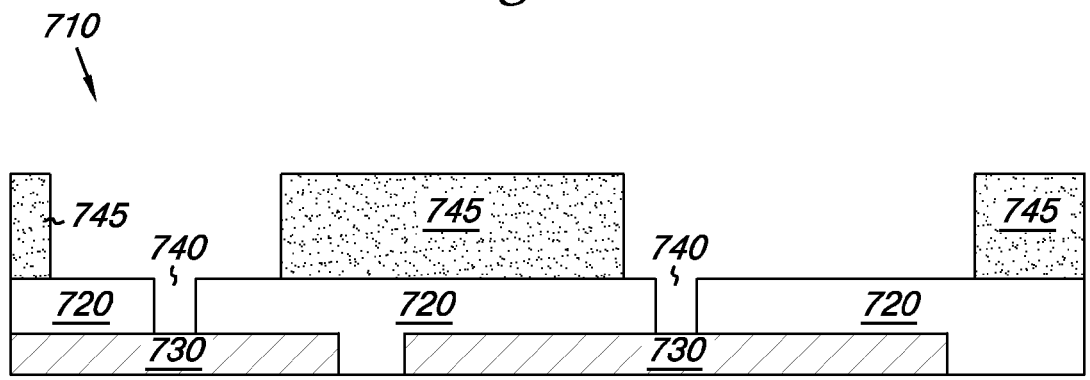
Figure 7H:
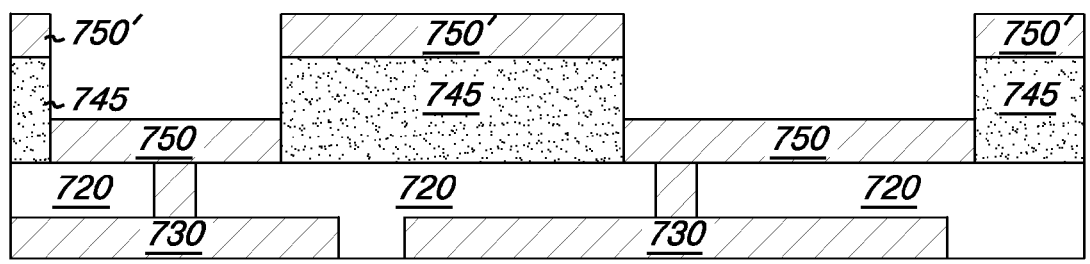
Figure 7I:
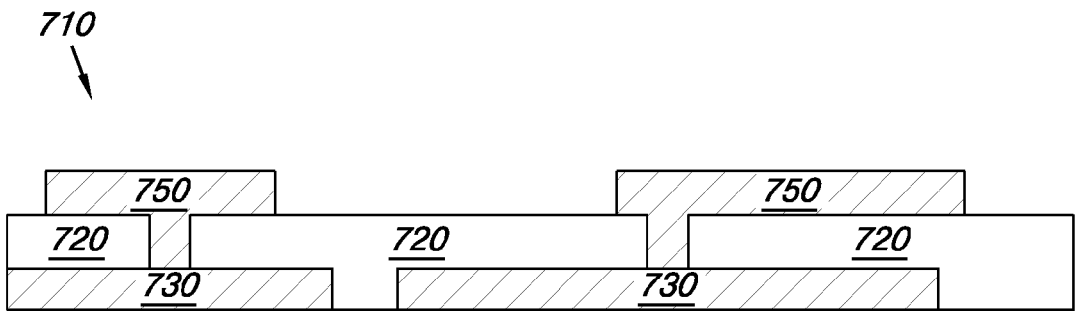
Figure 7J:
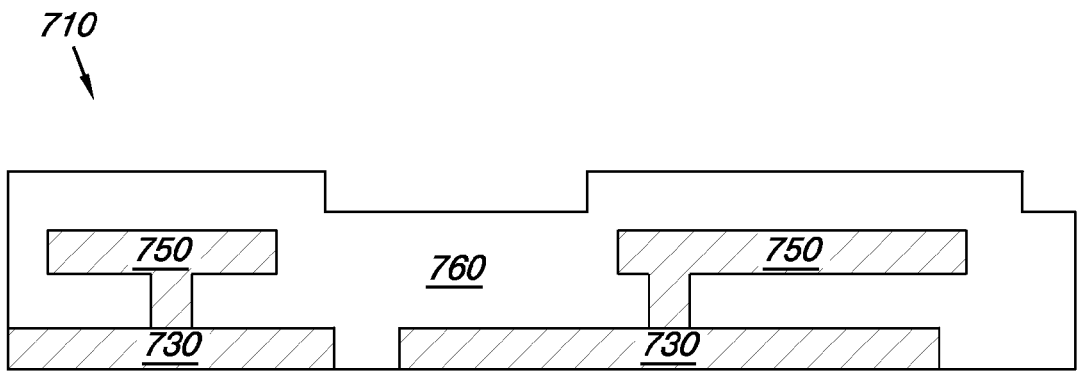
Figure 7K:
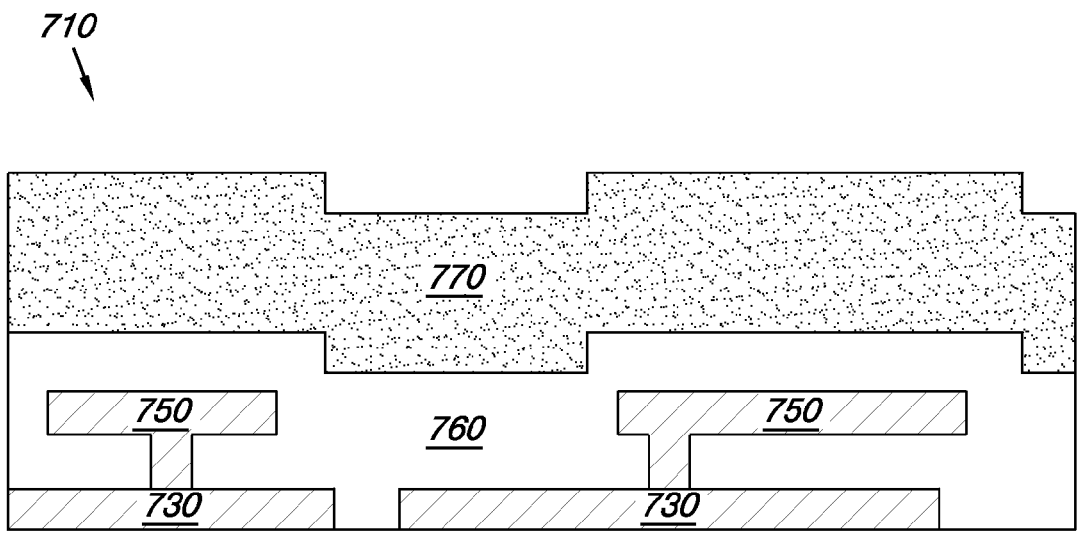
Figure 7L:
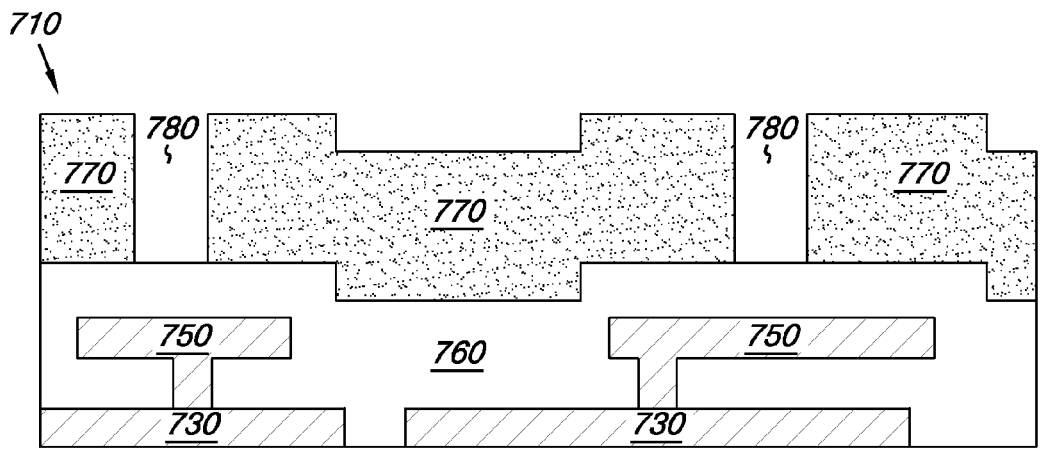
Figure 7M:
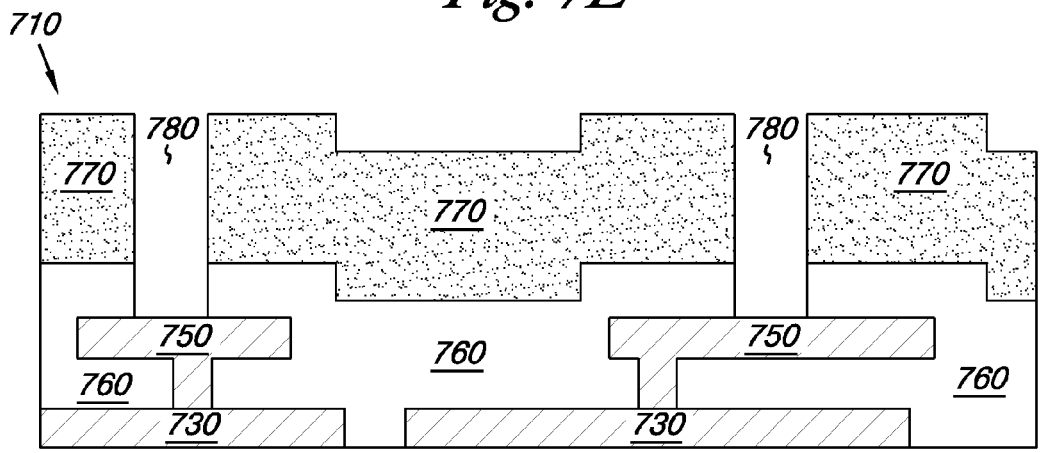
Figure 7N:
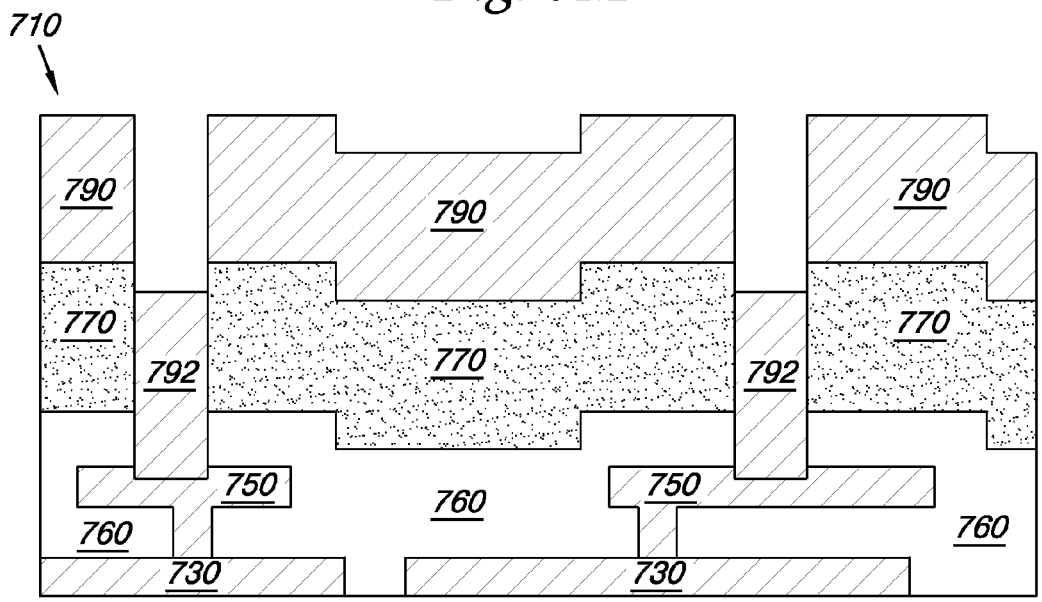
Figure 7O:
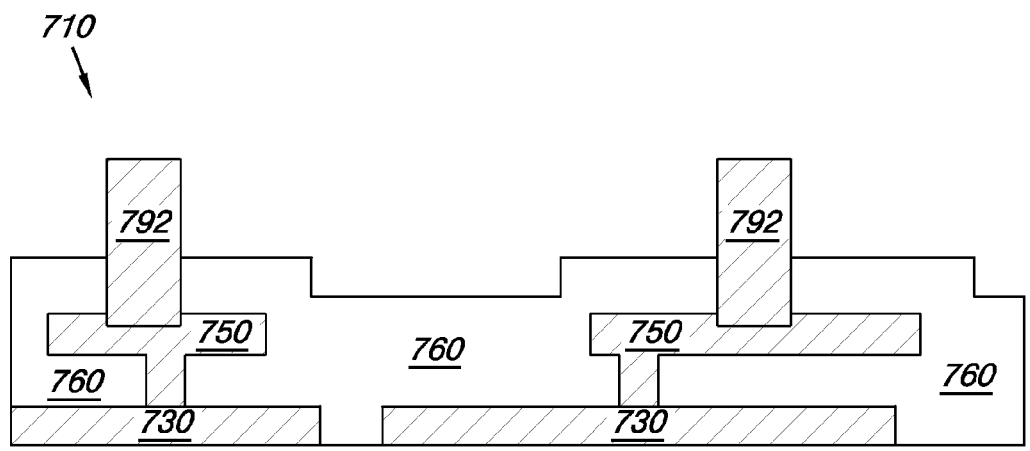
Figure 7P:
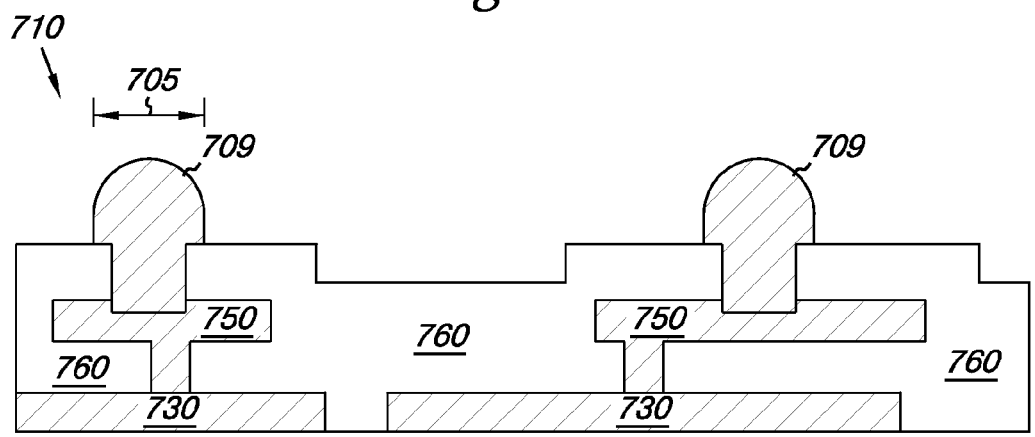
Figure 7Q:
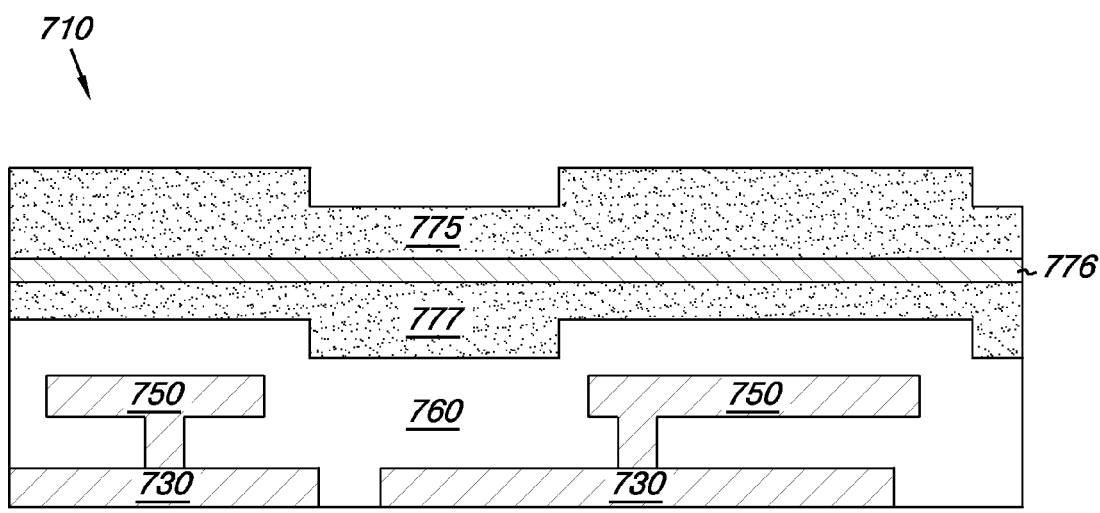

FIGS. 7A-7Q are cross-sectional views illustrating formation of wafer to wafer interconnects that can be used with one or more embodiments of the present disclosure. In FIGS. 7A-7Q, the wafer to wafer interconnects to be formed are micro solder bumps, e.g., C4 micro solder balls, such as those shown in FIGS. 1-5. Although the following explanation refers to a technique for placing solder balls on a wafer, those skilled in the art will recognize that the process described below can be performed on a single chip. Further, it will also be apparent to those skilled in the art that the process described below can be used to form solder balls on a module substrate or a circuit board, e.g., a computer mother board.

FIG. 7A shows an IC wafer 710 at a particular stage in a semiconductor device fabrication sequence. At this stage, an insulating layer 720, such as silicon dioxide ($SiO_2$), is deposited on a layer 730 of wafer 710 by a process such as chemical vapor deposition (CVD). The layer 730 can be a portion of the wafer 710 to be electrically coupled to a portion of a different wafer via a micro solder bump. In one or more embodiments, the layer 730 is one or more layers of metallurgy associated with the wafer 710. In some embodiments, the layer 730 can be a region of an active device formed in wafer 710 such as a diffusion region of a transistor formed in wafer 710, e.g., a source/drain region of a transistor. In some embodiments, the layer 730 can be a data line, e.g., a bit line, formed in wafer 710.

Embodiments are not limited to CVD silicon dioxide for the insulating layer 720. For instance, the layer 720 can be insulators such as polyimide, silicon nitride, or fluorinated silicon dioxide, among other insulators, and can be deposited by various other deposition techniques. In one or more embodiments, the insulating layer 720 is applied so that its thickness is at least 2 microns greater than the thickness of layer 730. FIG. 7B shows wafer 710 after being planarized using a chemical mechanical polishing process (CMP) to remove excess insulating layer 720.

FIG. 7C shows the wafer 710 at another particular stage in a semiconductor device fabrication sequence. At this stage, a first layer of photoresist 725 is deposited over the insulating layer 720. The photoresist layer 725 may be made of various types of photoresist known to those skilled in the art. The photoresist layer 725 is patterned and exposed to create via holes 740, as shown in FIG. 7D. The via holes 740 are then used to etch into and remove portions of the insulating layer 720. FIG. 7E shows the wafer 710 after the photoresist layer 725 has been exposed, the via holes 740 have been etched, and the photoresist layer 725 has been removed. The via holes 740 can be used to provide a connection between upper conductive levels of the wafer 710, such as a metal bond pad layers, and the layer 730.

FIG. 7F shows the wafer 710 at another particular stage in a semiconductor device fabrication sequence. At this stage, a second photoresist layer 745 is deposited on the upper surface of planarized insulating layer 720. As described further below, the layer 745 can be used as a first liftoff layer. In some embodiments, the layer 745 can be an insulator such as polyimide. The photoresist layer 745 is about 1.5 microns thick in one or more embodiments. FIG. 4G shows the wafer 710 after the photoresist layer 745 has been patterned and etched down to the insulating layer 720, leaving exposed those areas on layer 720 where metal bond pads, e.g., pads 750 shown in FIG. 7H, are desired.

FIG. 7H shows the wafer 710 at another particular stage in a semiconductor device fabrication sequence. At this stage, a metal stack including Zirconium (Zr), Nickel (Ni), Copper (Cu), and Gold (Au) is deposited on wafer 710. The metal stack includes layers 750 and 750' in FIG. 7H, with layer 750' being the portion of the metal stack deposited over the remaining areas of photoresist layer 745 and with layer 750 being the portion of the metal stack located in the etched areas. The metal stack can be formed by applying the four different metals, one at a time. The Gold layer can provide protection against oxidation, but is optional in the metal stack. In one or more embodiments, the thicknesses of each layer of metal is approximately: 500 Angstroms of Zr, 750 Angstroms of Ni, 5000 Angstroms of Cu, and 750 Angstroms of Au, although embodiments are not limited to particular thicknesses or to particular metals.

After the metal stack, e.g., layers 750/750', is applied over wafer 710, the layers 750' and 745 are removed using a liftoff process. In one or more embodiments, the liftoff process is a tape-assisted liftoff process. In such embodiments, the tape utilized is an adhesive-backed polymer, which is applied to the metallized resist layer such that it contacts metal stack layer 750'. The tape bonds to the metal stack layer 750', which is, in turn, bonded to the photoresist layer 745. The removal of the tape causes the metal layer 750' and remaining photoresist layer 745 to be stripped away, leaving metal pads 750 in only those areas which were previously etched in the photoresist layer 745. FIG. 7I shows the pads 750 of wafer 710 after the tape liftoff process.

FIG. 7J shows the wafer 710 at another particular stage in a semiconductor device fabrication sequence. At this stage, a second insulating layer 760 is deposited on the wafer 710. The insulating layer 760 can be formed of various insulating material, such as polyimide, silicon dioxide, silicon nitride, or fluorinated silicon dioxide, among other insulators. In one or more embodiments, the deposited portion of layer 760 is approximately 1.5 microns thick.

FIG. 7K shows the wafer 710 at another particular stage in a semiconductor device fabrication sequence. At this stage, a photoresist layer 770 is deposited on wafer 710. The layer 770 can be used as a second liftoff layer. The photoresist layer 770 can be a continuous layer of photoresist as shown in FIG. 7K. In one or more embodiments, the photoresist layer 770 may alternatively be a peel-away insulator, such as photosensitive polyimide.

In some embodiments, the photoresist layer can alternatively be a "hard mask" layer. An embodiment of the "hard mask" design is shown in FIG. 4Q, where a 500 Angstrom layer of silicon nitride ($Si_3N_4$) 776 is sandwiched between two photoresist layers 775 and 777. The upper most photoresist layer 775 can be approximately 0.5 microns thick, and the underlying photoresist layer 777 can be thick enough so that the entire stack, i.e., layers 775-777) is thicker than a layer of solder to be subsequently deposited. In the embodiment shown in FIG. 7Q, the lower level of photoresist 777 is approximately 0.5 microns thick.

In one or more embodiments, when using a continuous photoresist layer, e.g., layer 770 shown in FIG. 7K, the photoresist is at least as thick as the layer of solder which will be subsequently applied, e.g., approximately 3 microns. When using the "hard mask," however, the photoresist layers 775 and 777 shown in FIG. 7Q can be less thick, with the cumulative thickness of the layers 775-777 being at least as thick as the layer of solder to be applied.

FIG. 7L shows the wafer 710 at another particular stage in a semiconductor device fabrication sequence. At this stage, the photoresist layer 770 is exposed and patterned to produce vias 780 in the areas above the metal pads 750. The insulator 760 is etched through the vias 780 so that the metal pads 750 are exposed, as shown in FIG. 4M.

FIG. 7N shows the wafer 710 at another particular stage in a semiconductor device fabrication sequence. At this stage, a layer of solder 790 is deposited over the wafer 710. In one or more embodiments, the solder layer 790 is deposited so that it is at least 2.33 microns thick. Deposition of the solder layer 790 produces wafer interconnects 792, e.g., solder contacts 792, in the vias 780. The photoresist layer 770 and the solder layer 790 are removed using a liftoff process such as the tape liftoff process described above with reference to photoresist layer 745. For instance, the solder layer 790 and the photoresist layer 770 can be lifted away from the insulating layer 760 by an adhesive tape which is applied to the solder layer 790. The tape can be an adhesive backed polymer which is applied to the solder layer 790 and subsequently stripped off to remove the unwanted solder 790 and photoresist 770 layers.

Since the solder layer 790 bonds to the photoresist layer 770, the stripping action causes both layers, i.e., 770 and 790, to be removed simultaneously.

FIG. 7O shows the wafer 710 at another particular stage in a semiconductor device fabrication sequence. At this stage, the unwanted photoresist 770 and solder 790 have been removed as described in connection with FIG. 7N. As shown in FIG. O, solder contacts 792 which connect with metal pads 750 now project out of the top surface of insulating layer 760.

FIG. 7P shows the wafer 710 at another particular stage in a semiconductor device fabrication sequence. At this stage, the solder contacts 792 are heated to allow them to reflow. When the solder contacts 792 are reflowed they form solder ball contacts 709 having a shape similar to that shown in FIG. 7P. The solder ball contacts 709 formed using the method described in connection with FIGS. 7A-7Q have a diameter of about 2 microns. However, in one or more embodiments of the present disclosure, the solder contacts 709 can have a diameter greater or lesser than 2 microns.

In one or more embodiment of the present disclosure, a single liftoff procedure is used to form both the metal bond pads, e.g., pads 750 shown in FIGS. 7H-7Q, and the solder ball contacts, e.g., contacts 709 shown in FIG. 7P, instead of the multiple liftoff procedure described above in connection with FIGS. 7A-7Q. Such embodiments can be useful where contact pads are to be formed in the last metal layer 730, i.e., the pad metallurgy). This alternate process is explained below with reference to FIG. 7E and FIGS. 8A-8E).

Figure 8A:
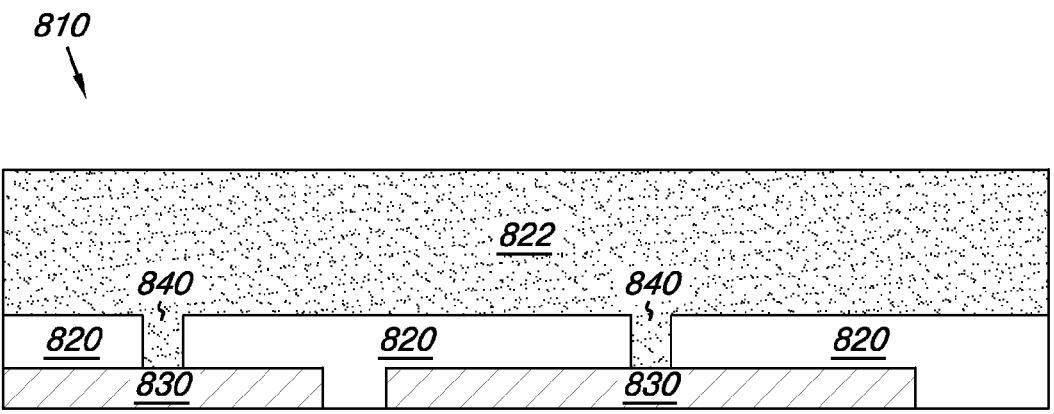
FIGS. 8A-8E are cross-sectional views illustrating formation of wafer to wafer interconnects that can be used with one or more embodiments of the present disclosure.

FIGS. 8A-8E are cross-sectional views illustrating formation of wafer to wafer interconnects that can be used with one or more embodiments of the present disclosure. FIG. 8A shows a wafer 810 at a particular stage in a semiconductor device fabrication sequence commencing from the structure of wafer 710 shown in FIG. 7E. In the stage shown in the sequence of FIG. 8A, the wafer 810 includes a photoresist layer 822 deposited on an insulating layer 820 having vias 840 etched therein. The vias 840 can be used to provide a connection between upper conductive levels of the wafer 810 and one or more layers of metallurgy 830 associated with the wafer 810. In one or more embodiments, the photoresist layer 822 of FIG. 8A is thicker than the photoresist layer 745 shown in FIG. 7E.

Figure 8B:
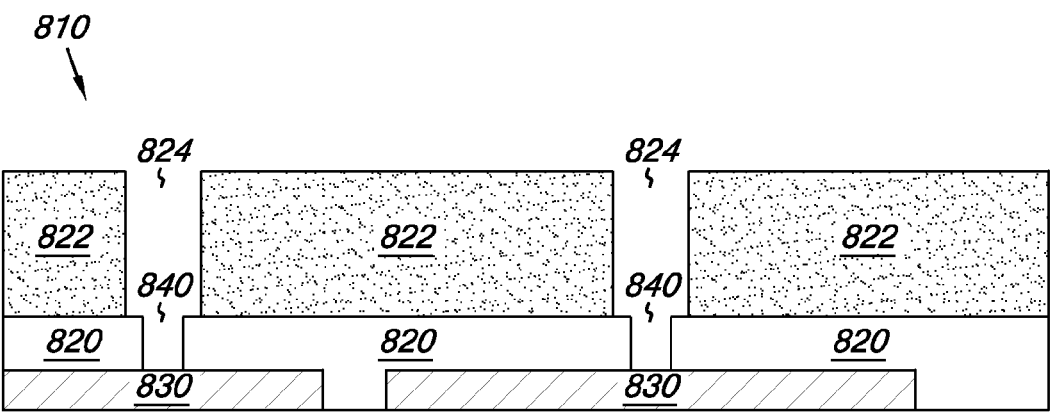

FIG. 8B shows the wafer 810 at another particular stage in a semiconductor device fabrication sequence. At this stage, holes 824 are formed, e.g., etched, in the photoresist 822. The size of holes 824 are selected according to the desired size of the solder ball contact, e.g., the larger the holes 824, the larger the diameter of the solder ball contact.

Figure 8C:
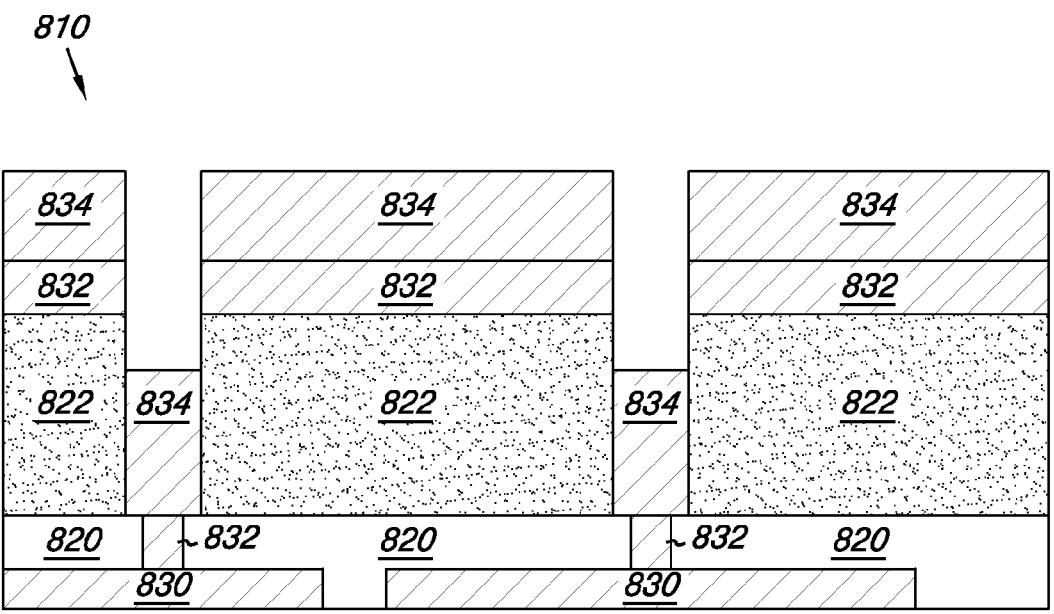
Figure 8D:
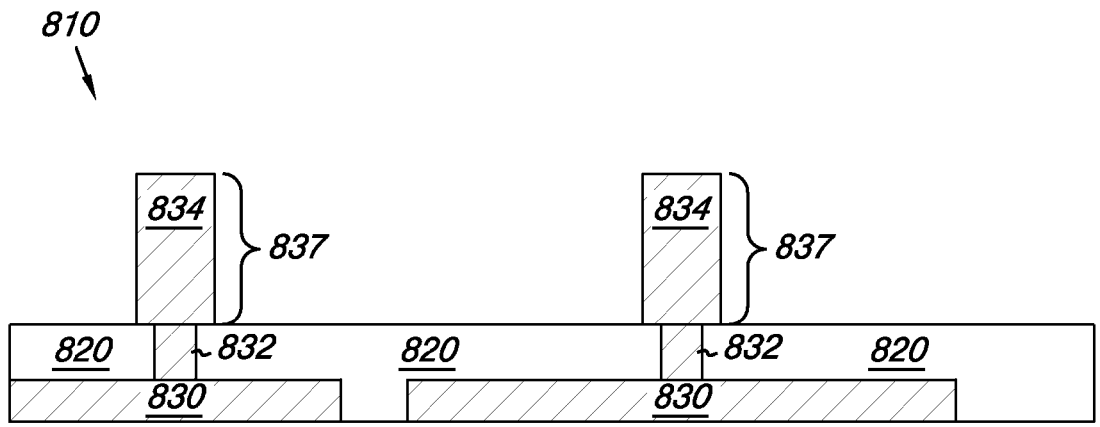
Figure 8E:
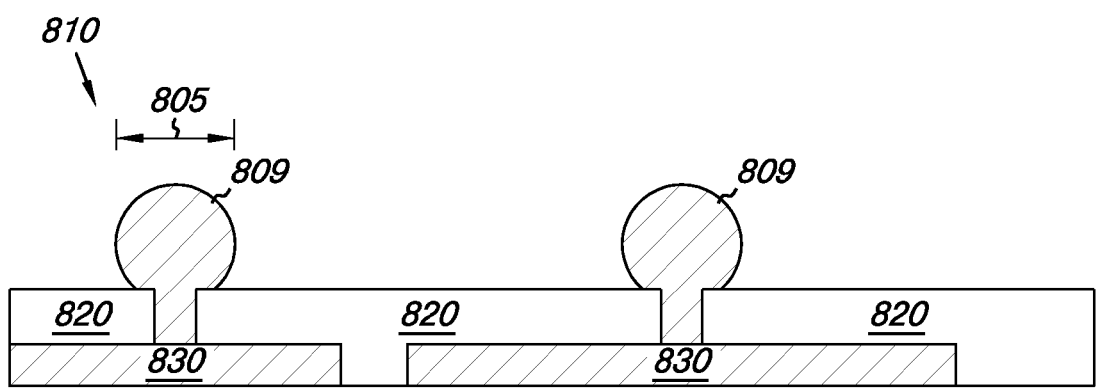

FIG. 8C shows the wafer 810 at another particular stage in a semiconductor device fabrication sequence. At this stage, a metal stack layer 832, e.g., metal stack layer 750 shown in FIG. 7H, is deposited on wafer 810 including in the holes 824 formed in the photoresist layer 822. The metal stack 832 can comprise layers of Zr, Ni, Cu, and Au, which can be deposited by the process described above with reference to FIG. 7H. As shown in FIG. 8C, a layer 834 of solder is then deposited on wafer 810. An ensuing liftoff process, e.g., a tape liftoff process, can remove the excess solder 834 and pad metal 832 to create a stack structure 837 shown in FIG. 8D. That is, the stack 837 is a composite stack with the four-layer metal pad layer 832 below the solder layer 834. The composite stack 837 forms a reflowable wafer to wafer interconnect 837 which can be reflowed to form the solder ball contacts 809 shown in FIG. 8E.

The solder ball contacts 809 formed using the method described in connection with FIGS. 8A-8E have a diameter of about 2 microns. However, in one or more embodiments of the present disclosure, the solder ball contacts 809 can have a diameter greater or lesser than 2 microns. That is, embodiments are not limited to a particular solder ball contact size.

In one or more embodiments, an alignment scheme can be used to properly align wafer interconnects, e.g., 792 or 837, located on a first wafer with appropriate bond pads on a second wafer to insure proper vertical alignment and face-to-face interconnection of the wafers.

In such embodiments, a coarse alignment technique can be used to determine the proper locations for the interconnects and the bond pads formed on the first and second wafer, respectively. The coarse alignment can involve forming vertical depressions, i.e., crystallographic "pits," in one of the wafers to be vertically aligned and interconnected, and forming complementary pyramidal elevations, i.e., crystallographic "tips," on the surface of the other wafer.

During bonding, the "pits" and "pyramids" can provide a coarse alignment between the interconnects on the first wafer and the corresponding bond pads on the second wafer. However, when the reflowable interconnects are heated and form the solder ball contacts, the solder ball contacts provide meniscus surface tension force which can move the wafers into exact alignment as well as provide a physical and an electrical bond.

As the reader will appreciate, vertically stacked wafers that are bonded and electrically coupled together can then be diced to produce a multitude of individual dies and/or chips bonded via solder ball contacts as described herein. Each individual chip can have a chip on chip structure, can be a "system on a chip," or can be bonded and electrically coupled to another chip or to a module substrate or circuit board.

Figure 9:
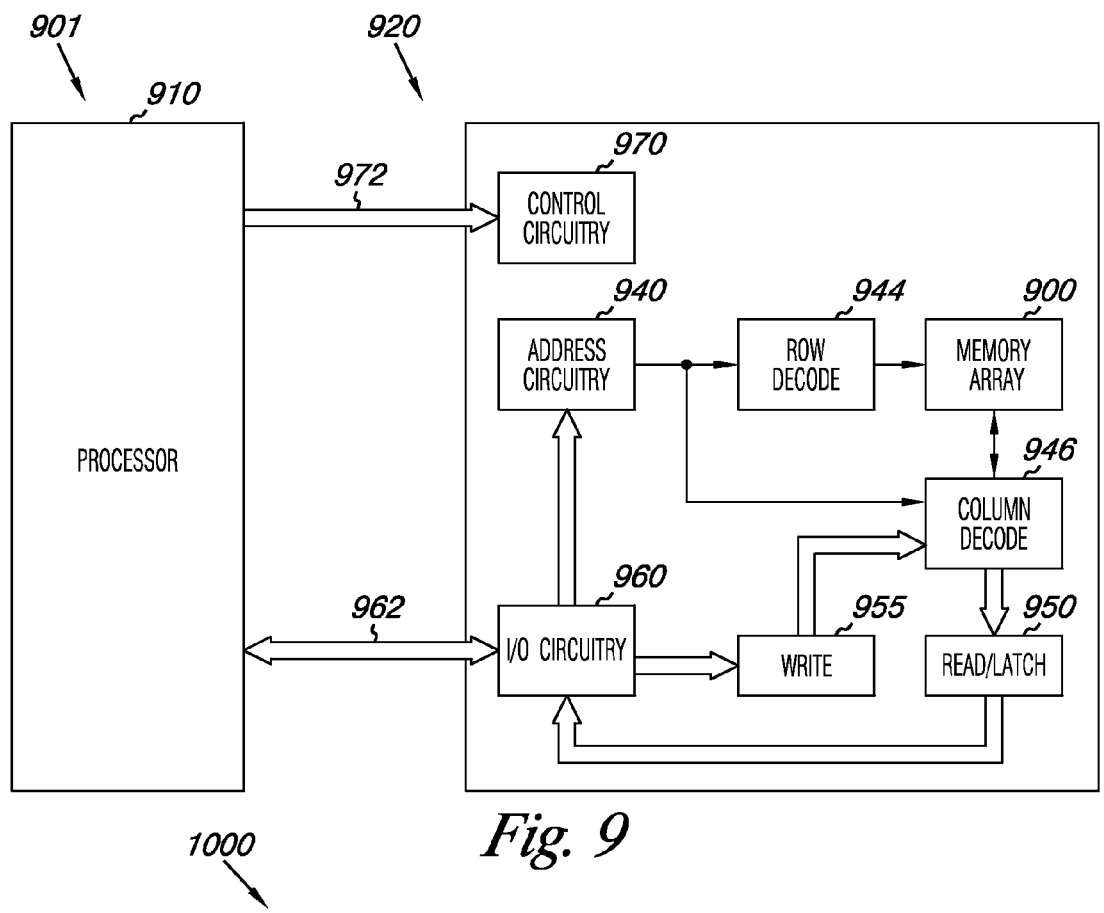
FIG. 9 is a functional block diagram of an electronic memory system including at least one memory device having a stacked wafer system in accordance with an embodiment of the present disclosure.

FIG. 9 is a functional block diagram of an electronic memory system 901 including at least one memory device 920 having a stacked wafer system in accordance with an embodiment of the present disclosure. Memory system 901 includes a processor 910 coupled to a memory device 920 that includes a memory array 900 of memory cells. The memory device 920 can include an array 900 of memory cells. The memory cells can be non-volatile cells such as Flash memory cells or can be DRAM cells or SRAM cells, among other types of memory cells.

The memory system 901 can include separate integrated circuits or both the processor 910 and the memory device 920 can be on the same integrated circuit. The processor 910 can be a microprocessor or some other type of controlling circuitry such as an application-specific integrated circuit (ASIC).

The embodiment of FIG. 9 includes address circuitry 940 to latch address signals provided over I/O connections 962 through I/O circuitry 960. Address signals are received and decoded by a row decoder 944 and a column decoder 946 to access the memory array 900.

The memory device 920 reads data in the memory array 900 by sensing voltage and/or current changes in the memory array columns using sense/buffer circuitry that in this embodiment can be read/latch circuitry 950. The read/latch circuitry 950 can read and latch a page or row of data from the memory array 900. I/O circuitry 960 is included for bi-directional data communication over the I/O connections 962 with the processor 910. Write circuitry 955 is included to write data to the memory array 900.

Control circuitry 970 decodes signals provided by control connections 972 from the processor 910. These signals can include chip signals, write enable signals, and address latch signals that are used to control the operations on the memory array 900, including data read, data write, and data erase operations. The control circuitry 970 can be a state machine, a sequencer, or some other type of controller.

Figure 10:
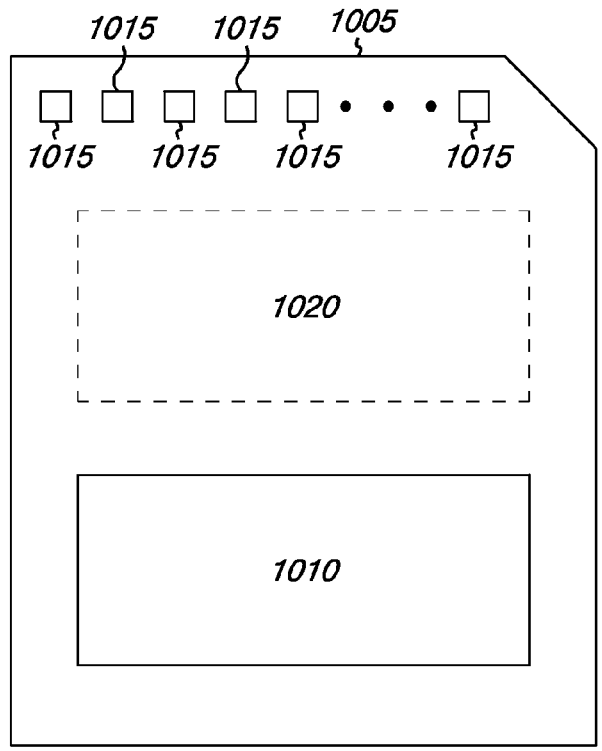
FIG. 10 is a functional block diagram of a memory module including at least one memory device having a stacked wafer system in accordance with an embodiment of the present disclosure.

FIG. 10 is a functional block diagram of a memory module 1000 including at least one memory device having a stacked wafer system in accordance with an embodiment of the present disclosure. Memory module 1000 is illustrated as a memory card, although the concepts discussed with reference to memory module 1000 are applicable to other types of removable or portable memory (e.g., USB flash drives) and are intended to be within the scope of "memory module" as used herein. In addition, although one example form factor is depicted in FIG. 10, these concepts are applicable to other form factors as well.

In one or more embodiments, memory module 1000 will include a housing 1005 (as depicted) to enclose one or more memory devices 1010, though such a housing is not essential to all devices or device applications. At least one memory device 1010 includes an array of memory cells in accordance with an embodiment of the present disclosure. Where present, the housing 1005 includes one or more contacts 1015 for communication with a host device. Examples of host devices include digital cameras, digital recording and playback devices, PDAs, personal computers, memory card readers, interface hubs and the like. For one or more embodiments, the contacts 1015 are in the form of a standardized interface. For example, with a USB flash drive, the contacts 1015 might be in the form of a USB Type-A male connector. For one or more embodiments, the contacts 1015 are in the form of a semi-proprietary interface, such as might be found on Compact-Flash™ memory cards licensed by SanDisk Corporation, Memory Stick™ memory cards licensed by Sony Corporation, SD Secure Digital™ memory cards licensed by Toshiba Corporation and the like. In general, however, contacts 1015 provide an interface for passing control, address and/or data signals between the memory module 1000 and a host having compatible receptors for the contacts 1015.

The memory module 1000 may optionally include additional circuitry 1020, which may be one or more integrated circuits and/or discrete components. For one or more embodiments, the additional circuitry 1020 may include control circuitry, such as a memory controller, for controlling access across multiple memory devices 1010 and/or for providing a translation layer between an external host and a memory device 1010. For example, there may not be a one-to-one correspondence between the number of contacts 1015 and a number of 1010 connections to the one or more memory devices 1010. Thus, a memory controller could selectively couple an I/O connection (not shown in FIG. 10) of a memory device 1010 to receive the appropriate signal at the appropriate I/O connection at the appropriate time or to provide the appropriate signal at the appropriate contact 1015 at the appropriate time. Similarly, the communication protocol between a host and the memory module 1000 may be different than what is required for access of a memory device 1010. A memory controller could then translate the command sequences received from a host into the appropriate command sequences to achieve the desired access to the memory device 1010. Such translation may further include changes in signal voltage levels in addition to command sequences.

The additional circuitry 1020 may further include functionality unrelated to control of a memory device 1010 such as logic functions as might be performed by an ASIC. Also, the additional circuitry 1020 may include circuitry to restrict read or write access to the memory module 1000, such as password protection, biometrics or the like. The additional circuitry 1020 may include circuitry to indicate a status of the memory module 1000. For example, the additional circuitry 1020 may include functionality to determine whether power is being supplied to the memory module 1000 and whether the memory module 1000 is currently being accessed, and to display an indication of its status, such as a solid light while powered and a flashing light while being accessed. The additional circuitry 1020 may further include passive devices, such as decoupling capacitors to help regulate power requirements within the memory module 1000.

Figure 11:
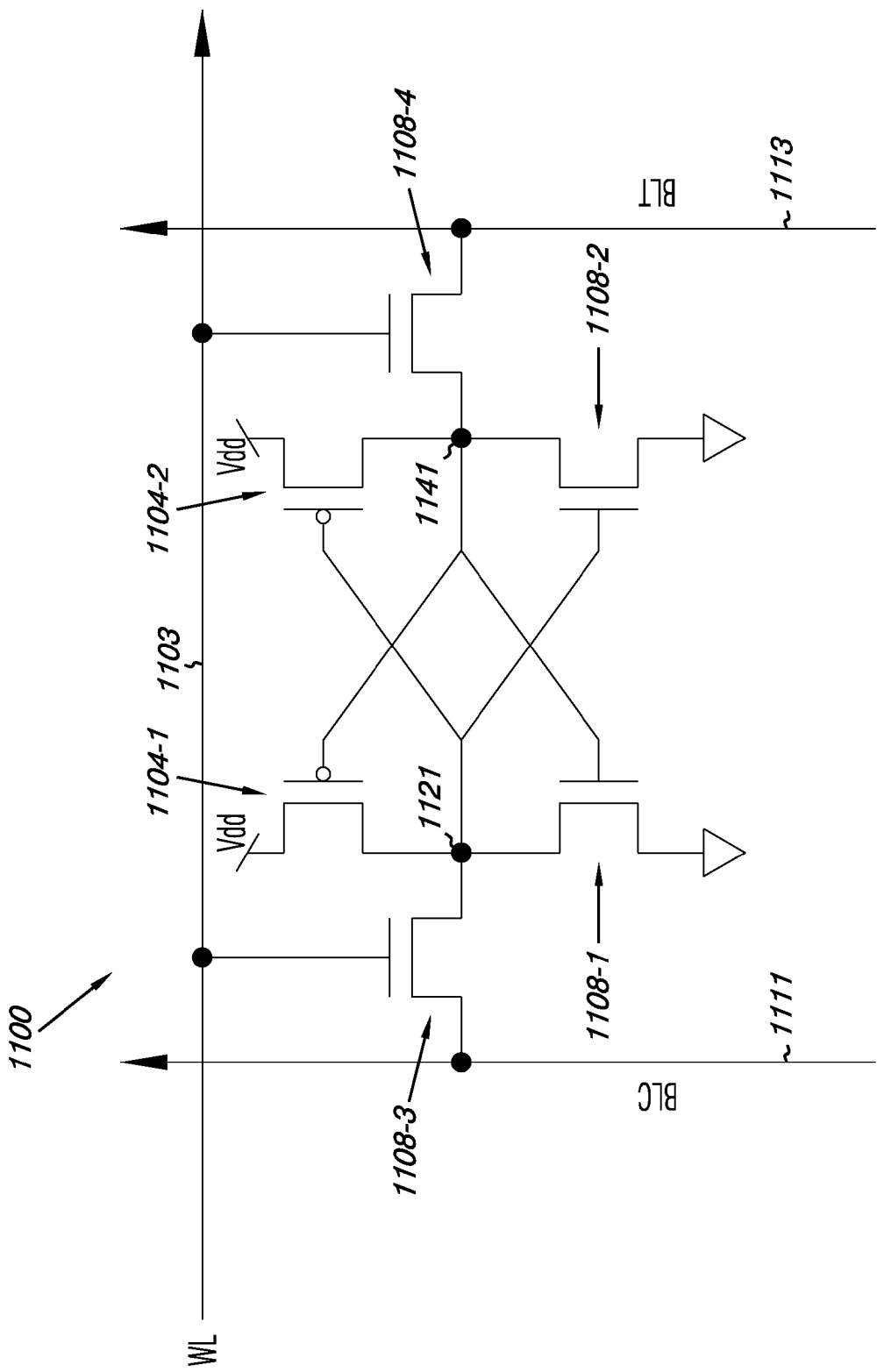
FIG. 11 illustrates an example of a memory cell formed in accordance with the embodiment illustrated in FIG. 1.

FIG. 11 illustrates an example of a memory cell 1100 formed in accordance with the embodiment illustrated in FIG. 1. In the embodiment illustrated in FIG. 11, the memory cell is a 6-transistor SRAM cell 1100. In this embodiment, the SRAM cell 1100 includes two PMOS transistors 1104-1 and 1104-2 and four NMOS transistors 1108-1, 1108-2, 1108-3, and 1108-4. In one or more embodiments, and as described above in connection with FIG. 1, the PMOS transistors 1104-1 and 1104-2 and NMOS transistors 1108-1, 1108-2, 1108-3, and 1108-4, are formed on separate wafers, e.g., wafers 110-1 and 110-2 shown in FIG. 1). That is, the memory cell 1100 is a SRAM cell 1100 formed via bonding and electrical coupling of a PMOS device wafer and an NMOS device wafer via a micro joint.

In the SRAM cell 1100 illustrated in FIG. 11, the transistors 1104-1 and 1108-1 and the transistors 1104-2 and 1108-2 are arranged as cross coupled inverter circuits. The PMOS transistors 1104-1 and 1104-2 are pull up transistors and the NMOS transistors 1108-1 and 1108-2 are pull down transistors. The transistors 1108-3 and 1108-4 are pass gate transistors that enable charge transfers between a pair of complementary bit lines 1111 (BLC) and 1113 (BLT) and a pair of data storage nodes 1121 and 1141. The transistors 1108-3 and 1108-4 are activated via a select line 1103, e.g., word line (WL) 1103.

As an example, the SRAM cell 1100 can be a cell in an array of SRAM cells, e.g., an embedded cache array and/or stand-alone array of SRAM cells 1100. As described above, forming the PMOS and NMOS transistors of an SRAM cell on separate wafers can provide benefits such as improved scalability, design flexibility, and/or performance as compared to SRAM arrays in which the PMOS and NMOS elements of the SRAM cells are fabricated together on the same wafer. For instance, forming the PMOS and NMOS elements on separate wafers can allow the PMOS and NMOS elements to be separately performance optimized as described above, which can lead to reduction or elimination of latch-up considerations, among other benefits. As such, SRAM cells and/or SRAM arrays formed in accordance with embodiments of the present disclosure can be designed within processors and/or systems on a chip and can have improved functional characteristics as compared to SRAM cells having PMOS and NMOS elements formed on the same wafer.

FIGS. 12A-12B illustrate a coarse alignment scheme that can be used with one or more stacked wafer system embodiments of the present disclosure. FIG. 12A illustrates a tip 1252 on the surface of a first wafer 1210-1 to be stacked in accordance with an embodiment of the present disclosure. Although only one tip 1252 is illustrated in FIG. 12A, the reader will appreciate that a number of tips 1252 can be formed on the surface of wafer 1210-1. FIG. 12B illustrates a number of pits 1254 on the surface of a second wafer 1210-2 to be stacked in accordance with an embodiment of the present disclosure.

As described above in connection with FIG. 1, the coarse alignment scheme shown in the embodiment of FIGS. 12A and 12B can be used as an initial alignment reference scheme to help insure proper location of various bond pads and/or solder contacts on the surfaces of wafers to be vertically stacked and interconnected. As an example, a number of tips 1252 can be formed on the surface of wafer 1210-1 prior to formation of bond pads and/or prior to formation of active devices, e.g., transistors, on the wafer 1210-1 that is to vertically stacked and connected to wafer 1210-1. In such embodiments, the a corresponding number of complementary pits 1254 are formed on the surface of the other wafer, e.g., 1210-2 in this example, to be vertically stacked. The pits 1254 can be formed via an anisotropic etching process using a mask of appropriate geometry and location. The tips 1252 can be formed via a process such as selective epitaxy. The complementary tips 1252 and pits 1254 on the opposing surfaces of the wafers to be vertically stacked and bonded, e.g., 1210-1 and 1210-2, can be used to enable effective interconnection of the active devices formed on the respective wafers.

Methods, devices, modules, and systems providing semiconductor devices in a stacked wafer system are described herein. One embodiment includes at least one CMOS device comprising a first wafer having NMOS transistors in a CMOS architecture and a second wafer having PMOS transistors in the CMOS architecture, wherein the first wafer is electrically coupled to the second wafer. Another embodiment includes a DRAM cell comprising a DRAM capacitor on a first wafer and support circuitry associated with the DRAM capacitor on a second wafer, wherein the first wafer is electrically coupled to the second wafer. Another embodiment includes a first wafer having a number of vertical transistors coupled to a bit line and a second wafer having amplifier circuitry associated with the number of vertical transistors, wherein the first wafer is electrically coupled to the second wafer.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for forming a CMOS device, the method comprising:
   forming a number of NMOS transistors on a first wafer using an NMOS process;
   forming a number of bond pads on the first wafer, the number of bond pads coupled to at least one of the number of NMOS transistors;
   forming a number of PMOS transistors on a second wafer using a PMOS process;
   forming a number of bond pads on the second wafer, the number of bond pads coupled to at least one of the number of PMOS transistors;
   bonding the first wafer and the second wafer to form at least one CMOS device; and
   providing relative alignment of corresponding bond pads on the first and second wafers, during bonding of the first and second wafers, via an initial alignment scheme that includes complementary coarse alignment structures formed on a surface of the first wafer and on a surface of the second wafer;
   wherein bonding the first wafer and the second wafer includes electrically coupling the first wafer to the second wafer with a number of reflowable interconnects.

2. The method of claim 1, wherein bonding includes electrically coupling in a manner that enables signal processing CMOS logic between the first wafer and the second wafer.

3. The method of claim 1, wherein the method includes bonding and electrically coupling the first wafer and the second wafer to form at least one static random access memory cell.

4. The method of claim 1, wherein at least some of the number of reflowable interconnects are micro solder balls having a diameter of not more than 5 microns.

5. The method of claim 4, wherein at least some of the number of reflowable interconnects are micro solder balls having a diameter of not more than 2 microns.

6. The method of claim 1, wherein forming at least one of the CMOS devices includes forming a CMOS device that is a three input logic circuit.

7. The method of claim 6, including forming the CMOS device that is a three input logic circuit by using at least three of the number of reflowable interconnects.

8. A method for forming a CMOS device, the method comprising:
   forming a number of NMOS transistors on a first wafer using an NMOS process;
   forming a number of bond pads on the first wafer, the number of bond pads coupled to at least one of the number of NMOS transistors;
   forming a number of PMOS transistors on a second wafer using a PMOS process;
   forming a number of bond pads on the second wafer, the number of bond pads coupled to at least one of the number of PMOS transistors;
   bonding the first wafer and the second wafer to form at least one CMOS device;
   forming a reflowable interconnect on at least one of the number of bond pads formed on the first wafer and the number of bond pads formed on the second wafer; and
   providing relative alignment of corresponding bond pads on the first and second wafers, during bonding of the first and second wafers, via an initial alignment scheme that includes complementary coarse alignment structures formed on a surface of the first wafer and on a surface of the second wafer.

9. The method of claim 8, wherein the method includes bonding a third wafer to the at least one of the first and the second wafer, wherein bonding the third wafer includes using a reflowable interconnect, the reflowable interconnect having different material properties from the reflowable interconnect formed on at least one of the number of bond pads formed on the first wafer and the number of bond pads formed on the second wafer.

10. The method of claim 8, wherein the method includes forming the complementary coarse alignment structures on the surface of the first and second wafer prior to forming the number of bond pads on the first and second wafer and prior to forming the reflowable interconnect.

11. The method of claim 8, wherein the method includes reflowing the reflowable interconnect to provide fine alignment of corresponding bond pads on the first and second wafers.

12. The method of claim 8, wherein the method includes further aligning corresponding bond pads by forming at least one solder ball by heating at least one of the first and second wafer to a reflow temperature associated with the reflowable interconnect and thereby creating a meniscus surface tension force.

13. A method for forming a CMOS device, the method comprising:

forming a number of NMOS transistors on a first wafer using an NMOS process;

forming a number of bond pads on the first wafer, the number of bond pads coupled to at least one of the number of NMOS transistors;

forming a number of PMOS transistors on a second wafer using a PMOS process;

forming a number of bond pads on the second wafer, the number of bond pads coupled to at least one of the number of PMOS transistors;

bonding the first wafer and the second wafer to form at least one CMOS device; and providing relative alignment of corresponding bond pads on the first and second wafers, during bonding of the first and second wafers, via an initial alignment scheme that includes complementary coarse alignment structures formed on a surface of the first wafer and on a surface of the second wafer;

wherein the complementary coarse alignment structures include a number of vertical depressions formed in the surface of one of the first and second wafer and a complementary number of vertical protrusions formed on the surface of one of the first and second wafer, and wherein the method includes;

forming the vertical depressions via an anisotropic etching process; and forming the vertical protrusions via selective epitaxy.

\* \* \* \* \*

UNITED STATES PATENT AND TRADEMARK OFFICE
CERTIFICATE OF CORRECTION

PATENT NO. : 7,875,529 B2  Page 1 of 1
APPLICATION NO. : 11/867733
DATED : January 25, 2011
INVENTOR(S) : Leonard Forbes et al.

It is certified that error appears in the above-identified patent and that said Letters Patent is hereby corrected as shown below:

In column 22, line 19, in Claim 13, delete "includes;" and insert -- includes: --, therefor.

Signed and Sealed this
Twenty-ninth Day of March, 2011

David J. Kappos
*Director of the United States Patent and Trademark Office*